(12) United States Patent
Tatsunari

(10) Patent No.: US 7,338,814 B2
(45) Date of Patent: Mar. 4, 2008

(54) METHOD FOR FABRICATING FERROELECTRIC CAPACITIVE ELEMENT AND FERROELECTRIC CAPACITIVE ELEMENT

(75) Inventor: Toshitaka Tatsunari, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/081,815

(22) Filed: Mar. 17, 2005

(65) Prior Publication Data

US 2005/0233476 A1      Oct. 20, 2005

(30) Foreign Application Priority Data

Mar. 25, 2004   (JP)   ............... 2004-089545
Dec. 9, 2004    (JP)   ............... 2004-357172

(51) Int. Cl.
   *H01L 21/00*   (2006.01)
(52) U.S. Cl. .......................... 438/3; 438/240
(58) Field of Classification Search ............... 438/3, 438/240

See application file for complete search history.

(56) References Cited

U.S. PATENT DOCUMENTS 5,989,927 A  *  11/1999  Yamanobe ............... 438/3
6,417,012 B1 *  7/2002  Kim et al. ............... 438/3
7,166,884 B2 *  1/2007  Yano et al. ............... 257/310

FOREIGN PATENT DOCUMENTS

JP       10-027888       1/1998

* cited by examiner

*Primary Examiner*—Jack Chen
(74) *Attorney, Agent, or Firm*—McDermott Will & Emery LLP

(57) ABSTRACT

A method for fabricating a ferroelectric capacitive element of this invention includes the steps of forming a lower electrode made of a first conductive film on a substrate; forming a first ferroelectric film including bismuth in a first concentration on the lower electrode; forming a second ferroelectric film including bismuth in a second concentration on the first ferroelectric film; performing annealing after forming the first ferroelectric film and the second ferroelectric film; and forming an upper electrode made of a second conductive film on the second ferroelectric film after the annealing. The first conductive film is a metal film more easily etched than a platinum film, and the second ferroelectric film is formed in such a manner that the second concentration is lower than the first concentration before the annealing.

8 Claims, 11 Drawing Sheets

Bi

Interface is unsharp

Ta

Interface is sharp

NUMBER OF DEFECTS OBTAINED AFTER DRY ETCHING

Electric short-circuit derived from platinum film peeled off from dry etching chamber PLATINUM FILM (101b)

CONDUCTIVE CERAMIC FILM (101a)

METHOD FOR FABRICATING FERROELECTRIC CAPACITIVE ELEMENT AND FERROELECTRIC CAPACITIVE ELEMENT

CROSS-REFERENCE TO RELATED APPLICATIONS

This application claims priority under 35 U.S.C. § 119 on Patent Application Nos. 2004-89545 and 2004-357172 filed in Japan respectively on Mar. 25, 2004 and Dec. 9, 2004, the entire contents of which are hereby incorporated by reference.

BACKGROUND OF THE INVENTION

The present invention relates to a ferroelectric capacitive element using, as a capacitor dielectric film, a bismuth-based layered perovskite type ferroelectric, that is, a dielectric metal oxide, thin film (hereinafter simply referred to as the ferroelectric thin film), and more particularly, it relates to a structure of the ferroelectric thin film and a method for forming the ferroelectric thin film.

Recently, there is a trend toward using an oxide film of a bismuth-based, and specifically, an SBT-based or a BST-based layered perovskite type as a ferroelectric thin film working as a capacitor dielectric film. Such an oxide film is applied to a semiconductor electronic device such as a RAM employing hysteresis of polarization inversion by utilizing the ferroelectric characteristic of the ferroelectric thin film. A ferroelectric capacitive element using such a ferroelectric thin film as a capacitor dielectric film is affected by annealing performed in fabrication of the ferroelectric capacitive element. Specifically, out diffusion is caused in the composition of a ferroelectric thin film through the annealing. Accordingly, it has become a significant problem to prevent degradation of the ferroelectric polarization characteristic by preventing the out diffusion of the composition of the ferroelectric thin film caused in the annealing.

In a conventional technique employed for overcoming this problem, a conductive ceramic film is used as at least one of an upper electrode and a lower electrode provided to a ferroelectric thin film and a platinum thin film is provided between the ferroelectric thin film and the conductive ceramic film. Thus, composition shift of the ferroelectric thin film caused through diffusion of a ferroelectric composite included in the ferroelectric thin film is prevented, so as to suppress the degradation of the ferroelectric characteristic (see, for example, Patent document 1: Japanese Laid-Open Patent Publication No. 10-27888 (p. 3, paragraph 15).

Now, a semiconductor device including a ferroelectric capacitive element according to the conventional technique disclosed in Patent document 1 will be described with reference to FIG. 14.

FIG. 14 is a cross-sectional view for showing the structure of the semiconductor device including the ferroelectric capacitive element of the conventional technique.

As shown in FIG. 14, on a substrate 100 made of a semiconductor substrate of monosilicon or the like or an insulating substrate of quartz or the like, a lower ferroelectric capacitor dielectric film electrode 101 made of a multilayered film including a conductive ceramic film 101a and a platinum thin film 101b formed in this order in the upward direction is formed. A ferroelectric capacitor dielectric film 102 is formed on the lower ferroelectric capacitor dielectric film electrode 101. An upper ferroelectric capacitor dielectric film electrode 103 made of a multilayered film including a platinum thin film 103a and a conductive ceramic film 103b formed in this order in the upward direction is formed on the ferroelectric capacitor dielectric film 102.

In this case, a semiconductor thin film of polysilicon or amorphous silicon, an interconnect layer, or an insulating film of $SiO_2$, $Si_3N_4$ or the like may be formed on the substrate 100. Also, the conductive ceramic film 101a or 103b is made from a rutile type oxide such as $RuO_2$, $IrO_x$ or $OsO_2$ or a perovskite type composite oxide such as $SrRuO_3$, $SrIrO_3$ or $ReO_3$. Furthermore, the ferroelectric capacitor dielectric film 102 is made from a lead-based perovskite type composite oxide such as $PbTiO_3$, $Pb(Zr_2Ti_{1-x})O_3$ or $Pb_yLa_{1-y}(Zr_xTi_{1-x})O_3$, a barium-based perovskite type composite oxide such as $Ba_xSr_{1-x}TiO_3$, or a bismuth-based layered composite oxide such as $SrBi_2Ta_2O_9$ or $Bi_4Ti_3O_{12}$.

In this manner, the platinum thin film 101b is disposed on the interface between the conductive ceramic film 101a and the ferroelectric capacitor dielectric film 102, and the platinum thin film 103a is disposed on the interface between the conductive ceramic film 103b and the ferroelectric capacitor dielectric film 102. Thus, the platinum thin films 101b and 103a prevent diffusion of elements included in the ferroelectric capacitor dielectric film 102, and therefore, the composition shift of the ferroelectric capacitor dielectric film 102 through the diffusion of a ferroelectric composite is prevented, so as to suppress the degradation of the ferroelectric characteristic.

According to this publication, the structure of the ferroelectric capacitive element shown in FIG. 14 is disclosed as a basic structure, the ferroelectric capacitor dielectric film electrode including the conductive ceramic film and the platinum thin film may be formed as merely one of the upper and lower electrodes, and the structure of the ferroelectric capacitor dielectric film electrode is not limited to the two-layered structure but may be a multilayered structure including a metal thin film of Ru, Ir or the like or a metal compound thin film of TiN, WSi or the like.

SUMMARY OF THE INVENTION

The present inventors have found that in various structures of a conventional ferroelectric capacitive element, since a platinum thin film is disposed between a ferroelectric capacitor dielectric film and a conductive ceramic film, it is very difficult to perform necessary refinement processing in forming a fine ferroelectric capacitive element.

This problem will now be described in detail.

For the refinement processing used in semiconductor process, dry etching is generally employed. In performing the refinement processing on the conventional multilayered structure including a conductive ceramic film and a platinum thin film, particles tend to be generated in etching the platinum thin film. Accordingly, in realizing the conventional structure of the ferroelectric capacitive element by the refinement processing, although the diffusion of the composition of the ferroelectric capacitor dielectric film can be prevented by the platinum thin films disposed on and below the ferroelectric capacitor dielectric film, the particles cause processing defects of the fine ferroelectric capacitive element.

FIG. 15 shows an example of the defects caused in the refinement processing of the conductive ceramic film and the platinum thin film. As shown in FIG. 15, the structure to be etched is a lower electrode having the multilayered structure including the platinum thin film and the conductive ceramic film.

As is obvious from FIG. 15, the processing defect is caused in the multilayered structure of the conductive ceramic film and the platinum thin film because particles of the platinum thin film or a by-product thereof generated during the etching work as masks, resulting in causing an electric short-circuit between the platinum thin film and the conductive ceramic film. In particular, when the refinement processing is performed, the distance between the conductive ceramic film and the platinum thin film is small, and therefore, in the case where particles of the platinum thin film or the by-product thereof, which are generated because the dry etching of the platinum thin film is very difficult as described above, have a size of 0.5 μm or more, a fatal defect occurs.

Also, in the etching of the platinum thin film, not only etching by a chemical reaction but also physical etching by sputtering etching is performed, and hence, the platinum or the by-product thereof tends to be adhered onto the inner wall of a dry etching chamber. Since the platinum or the by-product thereof thus adhered onto the inner wall is easily peeled off from the inner wall of the chamber during the etching, the peeled platinum or by-product works as a mask, so as to cause a defect in the processing of the conductive ceramic film.

As described so far, a platinum thin film used for preventing the composition shift of a ferroelectric capacitor dielectric film is not suitable from the viewpoint of the refinement processing of a semiconductor device including a ferroelectric capacitive element. Furthermore, in consideration of the refinement processing of the semiconductor device including the ferroelectric capacitive element, this problem occurs not only when a film used for preventing the composition shift of the ferroelectric capacitor dielectric film is the platinum thin film but also when the film includes a metal that is more difficult to be etched than at least platinum.

In consideration of the aforementioned conventional problem, an object of the invention is providing a method for fabricating a ferroelectric capacitive element and a ferroelectric capacitive element in which the composition shift of a ferroelectric capacitor dielectric film is prevented and occurrence of a defect in refinement processing is suppressed without using a platinum film.

In order to overcome the aforementioned problem, the first method for fabricating a ferroelectric capacitive element according to one aspect of this invention includes the steps of forming a lower electrode made of a first conductive film on a substrate; forming a first ferroelectric film including bismuth in a first concentration on the lower electrode; forming a second ferroelectric film including bismuth in a second concentration on the first ferroelectric film; performing annealing after forming the first ferroelectric film and the second ferroelectric film; and forming an upper electrode made of a second conductive film on the second ferroelectric film after the annealing, and the first conductive film is a metal film more easily etched than a platinum film, and the second ferroelectric film is formed in such a manner that the second concentration is lower than the first concentration before the annealing.

In the first method for fabricating a ferroelectric capacitive element, since the concentration of bismuth is higher in the first ferroelectric film than in the second ferroelectric film, after the bismuth is diffused from the first ferroelectric film to the lower electrode through the annealing, the bismuth composition in the first ferroelectric film and the second ferroelectric film becomes substantially homogeneous. Therefore, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used, and therefore, the occurrence of a processing defect of the ferroelectric capacitive element can be prevented.

The second method for fabricating a ferroelectric capacitive element according to one aspect of this invention includes the steps of forming a lower electrode made of a first conductive film on a substrate; forming a first ferroelectric film including bismuth in a first concentration on the lower electrode; performing first annealing after forming the first ferroelectric film; forming a second ferroelectric film including bismuth in a second concentration on the first ferroelectric film after the first annealing; performing second annealing after forming the second ferroelectric film; and forming an upper electrode made of a second conductive film on the second ferroelectric film after the second annealing, and the first conductive film is a metal film more easily etched than a platinum film, and the second ferroelectric film is formed in such a manner that the second concentration is lower than the first concentration before the annealing.

In the second method for fabricating a ferroelectric capacitive element, since the concentration of bismuth is higher in the first ferroelectric film than in the second ferroelectric film, after the bismuth is diffused from the first ferroelectric film to the lower electrode through the annealing, the bismuth composition in the whole of the first ferroelectric film and the second ferroelectric film becomes substantially homogeneous. Therefore, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used, and therefore, the occurrence of a processing defect of the ferroelectric capacitive element can be prevented. Furthermore, since the annealing is performed after forming the respective ferroelectric films, the bismuth composition in the whole of the first ferroelectric film and the second ferroelectric film can be easily made substantially homogeneous, and therefore, the ferroelectric film can attain a more sufficient ferroelectric characteristic.

The third method for fabricating a ferroelectric capacitive element according to one aspect of this invention includes the steps of forming a lower electrode made of a first conductive film on a substrate; forming a ferroelectric film including bismuth on the lower electrode; performing annealing after forming the ferroelectric film; and forming an upper electrode made of a second conductive film on the ferroelectric film after the annealing, and the first conductive film is a metal film more easily etched than a platinum film, and the ferroelectric film is formed so as to have, before the annealing, inclined gradient of a bismuth concentration reducing along the thickness direction of the ferroelectric film from the side of the lower electrode to the side of the upper electrode.

In the third method for fabricating a ferroelectric capacitive element, since the ferroelectric film is formed so as to have the inclined gradient of the bismuth concentration reducing along the thickness direction thereof from the side of the lower electrode to the side of the upper electrode, after the bismuth is diffused from the ferroelectric film to the lower electrode through the annealing, the bismuth composition in the ferroelectric film becomes substantially homogeneous. Therefore, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used, and therefore, the occurrence of a processing defect of the ferroelectric capacitive element can be prevented. Furthermore, since the ferroelectric film is formed so as to have the inclined gradient of the bismuth concentration reducing along the thickness direction thereof from the side of the lower electrode to the side of the upper electrode, the inclined gradient of the bismuth concentration can be more finely caused. Therefore, the bismuth composition can be more easily made substantially homogeneous in the ferroelectric film, so that the ferroelectric film can attain a more sufficient ferroelectric characteristic.

The fourth method for fabricating a ferroelectric capacitive element according to one aspect of this invention includes the steps of forming a lower electrode made of a first conductive film on a substrate; forming, on the lower electrode, a ferroelectric film having a multilayered structure in which each layer includes bismuth; performing annealing after forming the ferroelectric film; and forming an upper electrode made of a second conductive film on the ferroelectric film after the annealing, and the first conductive film is a metal film more easily etched than a platinum film, and respective layers of the ferroelectric film are formed in such a manner that bismuth concentrations therein are gradually reduced from the side of the lower electrode to the side of the upper electrode.

In the fourth method for fabricating a ferroelectric capacitive element, since the ferroelectric film has the multilayered structure in which each layer includes bismuth and the bismuth concentrations in the respective layers are reduced from the side of the lower electrode to the side of the upper electrode, after the bismuth is diffused from the ferroelectric film to the lower electrode through the annealing, the bismuth composition in the ferroelectric film becomes substantially homogeneous. Therefore, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used, and therefore, the occurrence of a processing defect of the ferroelectric capacitive element can be prevented. Furthermore, since the ferroelectric film is formed so that the bismuth concentrations in the respective layers are reduced from the side of the lower electrode to the side of the upper electrode, the inclined gradient of the bismuth concentration can be more finely caused. Therefore, the bismuth composition can be more easily made substantially homogeneous in the ferroelectric film, so that the ferroelectric film can attain a more sufficient ferroelectric characteristic.

The fifth method for fabricating a ferroelectric capacitive element according to one aspect of this invention includes the steps of forming a lower electrode made of a first conductive film on a substrate; forming a ferroelectric film made of an SBT film or an SBTN film on the lower electrode; performing annealing after forming the ferroelectric film; and forming an upper electrode made of a second conductive film on the ferroelectric film, and the first conductive film is a metal film more easily etched than a platinum film, and the ferroelectric film is formed in such a manner that a bismuth composition ratio therein is higher than a bismuth composition ratio in stoichiometric composition before the annealing.

In the fifth method for fabricating a ferroelectric capacitive element, since the ferroelectric film is formed in such a manner that the bismuth composition ratio therein is higher than in stoichiometric composition, after the bismuth is diffused from the ferroelectric film to the lower electrode through the annealing, the bismuth composition in the ferroelectric film becomes substantially homogeneous. Therefore, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used, and therefore, the occurrence of a processing defect of the ferroelectric capacitive element can be prevented.

In any of the first through fifth methods for fabricating a ferroelectric capacitive element, when the first conductive film is a noble metal oxide film or a multilayered film of a noble metal oxide and a noble metal that is more easily etched than a platinum film, the occurrence of a processing defect of the ferroelectric capacitive element can be prevented.

In any of the first through fifth methods for fabricating a ferroelectric capacitive element, when the second conductive film is a noble metal oxide film or a multilayered film of a noble metal oxide and a noble metal that is more easily etched than a platinum film, the occurrence of a processing defect of the ferroelectric capacitive element can be prevented. Furthermore, the second conductive film is more preferably a multilayered film of a noble metal oxide and a noble metal, and in this case, a problem of operation delay in a fast operation of a transistor can be overcome. This is because the sheet resistance can be suppressed to $1/10$ through $1/100$ when the second conductive film is a multilayered film of a noble metal oxide and a noble metal as compared with the case where it is made of a metal oxide film alone.

The sixth method for fabricating a ferroelectric capacitive element according to one aspect of the invention includes the steps of forming a lower electrode on a substrate; forming a ferroelectric film made of an SBT film or an SBTN film and having a multilayered structure on the lower electrode; forming a layer including a group V element and bismuth between the lower electrode and the ferroelectric film by performing annealing after forming the ferroelectric film; and forming an upper electrode on the ferroelectric film after the annealing, and a layer of the ferroelectric film in contact with the lower electrode is formed in such a manner that a bismuth composition ratio therein is higher than a bismuth composition ratio in stoichiometric composition.

In the sixth method for fabricating a ferroelectric capacitive element, since the bismuth composition ratio in the layer of the ferroelectric film, which has the multilayered structure, in contact with the lower electrode is set to be higher than in the stoichiometric composition, after the bismuth is diffused from the ferroelectric film to the lower electrode through the annealing, the bismuth composition in the ferroelectric film becomes substantially homogeneous. Therefore, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used, and therefore, the occurrence of a processing defect of the ferroelectric capacitive element can be prevented. Furthermore, since the layer including the group V element and the bismuth is formed between the ferroelectric film and the lower electrode, the bismuth diffused from the ferroelectric film can be efficiently captured. Therefore, when the layer having captured the bismuth is analyzed, the amount of bismuth diffused from and going out of the ferroelectric film can be previously grasped, and hence, the composition of the ferroelectric film can be more effectively controlled. On that point, in the first through fifth methods for fabricating a ferroelectric capacitive element, the bismuth diffused from and going out of the ferroelectric film is not captured but reaches the side of the lower electrode, and hence, it is not easy to predict the amount of bismuth diffused from and going out of the ferroelectric film. Therefore, in these methods, the control of the composition of the ferroelectric film is unavoidably unstable. In contrast, in the sixth method, the composition of the ferroelectric film can be more accurately controlled, so that the ferroelectric characteristic can be more improved.

The seventh method for fabricating a ferroelectric capacitive element according to one aspect of the invention includes the steps of forming a lower electrode on a substrate; forming a ferroelectric film made of an SBT film or an SBTN film on the lower electrode; forming a layer including a group V element and bismuth between the lower electrode and the ferroelectric film by performing annealing after forming the ferroelectric film; and forming an upper electrode on the ferroelectric film after the annealing, and the ferroelectric film is formed so as to have inclined gradient of a bismuth concentration reducing along the thickness direction thereof from the side of the lower electrode to the side of the upper electrode before the annealing.

In the seventh method for fabricating a ferroelectric capacitive element, since the ferroelectric film is formed so as to have the inclined gradient of the bismuth concentration reducing along the thickness direction from the side of the lower electrode to the side of the upper electrode, after the bismuth is diffused from the ferroelectric film to the lower electrode through the annealing, the bismuth composition in the ferroelectric film becomes substantially homogeneous. Therefore, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used, and therefore, the occurrence of a processing defect of the ferroelectric capacitive element can be prevented. Also, since the ferroelectric film is formed so as to have the inclined gradient of the bismuth concentration reducing along the thickness direction from the side of the lower electrode to the side of the upper electrode, the inclined gradient of the bismuth concentration can be more finely caused. Therefore, the bismuth composition in the ferroelectric film can be more easily made substantially homogeneous, and hence, the ferroelectric film can attain a more sufficient ferroelectric characteristic. Furthermore, since the layer including the group V element and the bismuth is formed between the ferroelectric film and the lower electrode, the bismuth diffused from the ferroelectric film can be efficiently captured. Therefore, when the layer having captured the bismuth is analyzed, the amount of bismuth diffused from and going out of the ferroelectric film can be previously grasped, and hence, the composition of the ferroelectric film can be more effectively controlled. On that point, in the first through fifth methods for fabricating a ferroelectric capacitive element, the bismuth diffused from and going out of the ferroelectric film is not captured but reaches the side of the lower electrode, and hence, it is not easy to predict the amount of bismuth diffused from and going out of the ferroelectric film. Therefore, in these methods, the control of the composition of the ferroelectric film is unavoidably unstable. In contrast, in the seventh method, the composition of the ferroelectric film can be more accurately controlled, so that the ferroelectric characteristic can be more improved.

The eighth method for fabricating a ferroelectric capacitive element according to one aspect of the invention includes the steps of forming a lower electrode on a substrate; forming a ferroelectric film made of an SBT film or an SBTN film on the lower electrode; forming a layer including a group V element and bismuth between the lower electrode and the ferroelectric film by performing annealing after forming the ferroelectric film; and forming an upper electrode on the ferroelectric film after the annealing, and the ferroelectric film is formed in such a manner that a bismuth composition ratio therein is higher than a bismuth composition ratio in stoichiometric composition before the annealing.

In the eighth method for fabricating a ferroelectric capacitive element, since the ferroelectric film is formed in such a manner that the bismuth composition ratio therein is higher than in the stoichiometric composition, after the bismuth is diffused from the ferroelectric film to the lower electrode through the annealing, the bismuth composition in the ferroelectric film becomes substantially homogeneous. Therefore, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used, and therefore, the occurrence of a processing defect of the ferroelectric capacitive element can be prevented. Furthermore, since the layer including the group V element and the bismuth is formed between the ferroelectric film and the lower electrode, the bismuth diffused from the ferroelectric film can be efficiently captured. Therefore, when the layer having captured the bismuth is analyzed, the amount of bismuth diffused from and going out of the ferroelectric film can be previously grasped, and hence, the composition of the ferroelectric film can be more effectively controlled. On that point, in the first through fifth methods for fabricating a ferroelectric capacitive element, the bismuth diffused from and going out of the ferroelectric film is not captured but reaches the side of the lower electrode, and hence, it is not easy to predict the amount of bismuth diffused from and going out of the ferroelectric film. Therefore, in these methods, the control of the composition of the ferroelectric film is unavoidably unstable. In contrast, in the eighth method, the composition of the ferroelectric film can be more accurately controlled, so that the ferroelectric characteristic can be more improved.

The ninth method for fabricating a ferroelectric capacitive element according to one aspect of the invention includes the steps of forming a lower electrode on a substrate; forming a ferroelectric film made of an SBT film or an SBTN film and having a multilayered structure including bismuth on the lower electrode; forming an upper electrode on the ferroelectric film; and forming layers each including a group V element and bismuth respectively between the lower electrode and the ferroelectric film and between the ferroelectric film and the upper electrode by performing annealing after forming the upper electrode, and layers of the ferroelectric film respectively in contact with the lower electrode and the upper electrode are formed in such a manner that a bismuth composition ratio therein is higher than a bismuth composition ratio in stoichiometric composition before the annealing.

In the ninth method for fabricating a ferroelectric capacitive element, since the bismuth composition ratios in the layers of the ferroelectric film, which has the multilayered structure, respectively in contact with the lower electrode and the upper electrode are set to be higher than in the stoichiometric composition, after the bismuth is diffused from the ferroelectric film to the lower electrode and the upper electrode through the annealing, the bismuth composition in the ferroelectric film becomes substantially homogeneous. Therefore, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used as the lower electrode and the upper electrode, and therefore, the occurrence of a processing defect of the ferroelectric capacitive element can be prevented. Furthermore, since the layers including the group V element and the bismuth are formed between the ferroelectric film and the lower electrode and between the ferroelectric film and the upper electrode, the bismuth diffused from the ferroelectric film can be efficiently captured. Therefore, when the layers having captured the bismuth are analyzed, the amount of bismuth diffused from and going out of the ferroelectric film can be previously grasped, and hence, the composition of the ferroelectric film can be more effectively controlled. On that point, in the first through fifth methods for fabricating a ferroelectric capacitive element, the bismuth diffused from and going out of the ferroelectric film is not captured but reaches the side of the lower electrode or the upper electrode, and hence, it is not easy to predict the amount of bismuth diffused from and going out of the ferroelectric film. Therefore, in these methods, the control of the composition of the ferroelectric film is unavoidably unstable. In contrast, in the ninth method, the composition of the ferroelectric film can be more accurately controlled, so that the ferroelectric characteristic can be more improved. Moreover, since the annealing is performed after forming the upper electrode, the semiconductor fabrication process cost can be reduced. This is for the following reason: In general, for planarization to eliminate a level difference between a memory (storage) part and a logic part of a semiconductor memory device, a method for performing planarization flow by annealing a BPSG film or a method for performing planarization CMP by annealing a BPSG film is employed. In such a fabrication method, when the ferroelectric film is annealed after forming the upper electrode, the annealing of the ferroelectric film and the annealing of the BPSG film can be simultaneously performed. As a result, the fabrication cost can be reduced.

The tenth method for fabricating a ferroelectric capacitive element according to one aspect of the invention includes the steps of forming a lower electrode on a substrate; forming a ferroelectric film made of an SBT film or an SBTN film on the lower electrode; forming an upper electrode on the ferroelectric film; forming layers each including a group V element and bismuth respectively between the lower electrode and the ferroelectric film and between the ferroelectric film and the upper electrode by performing annealing after forming the upper electrode, and the ferroelectric film is formed so as to have inclined gradient of a bismuth concentration gradually reducing along the thickness direction thereof from the side of the lower electrode to substantially the center of the ferroelectric film and gradually increasing from substantially the center of the ferroelectric film to the side of the upper electrode.

In the tenth method for fabricating a ferroelectric capacitive element, since the ferroelectric film is formed so as to have the inclined gradient of the bismuth concentration gradually reducing along the thickness direction thereof from the side of the lower electrode to substantially the center of the ferroelectric film and gradually increasing from substantially the center of the ferroelectric film to the side of the upper electrode, after the bismuth is diffused from the ferroelectric film to the lower electrode and the upper electrode through the annealing, the bismuth composition in the ferroelectric film becomes substantially homogeneous. Therefore, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used as the lower electrode and the upper electrode, and therefore, the occurrence of a processing defect of the ferroelectric capacitive element can be prevented. Moreover, since the ferroelectric film is formed so as to have the inclined gradient of the bismuth concentration gradually reducing along the thickness direction thereof from the side of the lower electrode to substantially the center of the ferroelectric film and gradually increasing from substantially the center of the ferroelectric film to the side of the upper electrode, the inclined gradient of the bismuth concentration can be more finely caused. Therefore, the bismuth composition can be more easily made substantially homogeneous in the ferroelectric film, so that the ferroelectric film can attain a more sufficient ferroelectric characteristic. Furthermore, since the layers including the group V element and the bismuth are formed respectively between the ferroelectric film and the lower electrode and between the ferroelectric film and the upper electrode, the bismuth diffused from the ferroelectric film can be efficiently captured. Therefore, when the layers having captured the bismuth are analyzed, the amount of bismuth diffused from and going out of the ferroelectric film can be previously grasped, and hence, the composition of the ferroelectric film can be more effectively controlled. On that point, in the first through fifth methods for fabricating a ferroelectric capacitive element, the bismuth diffused from and going out of the ferroelectric film is not captured but reaches the side of the lower electrode or the upper electrode, and hence, it is not easy to predict the amount of bismuth diffused from and going out of the ferroelectric film. Therefore, in these methods, the control of the composition of the ferroelectric film is unavoidably unstable. In contrast, in the tenth method, the composition of the ferroelectric film can be more accurately controlled, so that the ferroelectric characteristic can be more improved. Furthermore, since the annealing is performed after forming the upper electrode, the semiconductor fabrication process cost can be reduced. This is for the following reason: In general, for planarization to eliminate a level difference between a memory (storage) part and a logic part of a semiconductor memory device, a method for performing planarization flow by annealing a BPSG film or a method for performing planarization CMP by annealing a BPSG film is employed. In such a fabrication method, when the ferroelectric film is annealed after forming the upper electrode, the annealing of the ferroelectric film and the annealing of the BPSG film can be simultaneously performed. As a result, the fabrication cost can be reduced.

The eleventh method for fabricating a ferroelectric capacitive element according to one aspect of the invention includes the steps of forming a lower electrode on a substrate; forming a ferroelectric film made of an SBT film or an SBTN film on the lower electrode; forming an upper electrode on the ferroelectric film; and forming layers each including a group V element and bismuth respectively between the lower electrode and the ferroelectric film and between the ferroelectric film and the upper electrode by performing annealing after forming the upper electrode, and the ferroelectric film is formed in such a manner that a bismuth composition ratio therein is higher than in stoichiometric composition before the annealing.

In the eleventh method for fabricating a ferroelectric capacitive element, since the ferroelectric film is formed in such a manner that the bismuth composition ratio therein is higher than in the stoichiometric composition, after the bismuth is diffused from the ferroelectric film to the lower electrode and the upper electrode through the annealing, the bismuth composition in the ferroelectric film becomes substantially homogeneous. Therefore, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used as the lower electrode and the upper electrode, and therefore, the occurrence of a processing defect of the ferroelectric capacitive element can be prevented. Furthermore, since the layers including the group V element and the bismuth are formed respectively between the ferroelectric film and the lower electrode and between the ferroelectric film and the upper electrode, the bismuth diffused from the ferroelectric film can be efficiently captured. Therefore, when the layers having captured the bismuth are analyzed, the amount of bismuth diffused from and going out of the ferroelectric film can be previously grasped, and hence, the composition of the ferroelectric film can be more effectively controlled. On that point, in the first through fifth methods for fabricating a ferroelectric capacitive element, the bismuth diffused from and going out of the ferroelectric film is not captured but reaches the side of the lower electrode or the upper electrode, and hence, it is not easy to predict the amount of bismuth diffused from and going out of the ferroelectric film. Therefore, in these methods, the control of the composition of the ferroelectric film is unavoidably unstable. In contrast, in the sixth method, the composition of the ferroelectric film can be more accurately controlled, so that the ferroelectric characteristic can be more improved. Moreover, since the annealing is performed after forming the upper electrode, the semiconductor fabrication process cost can be reduced. This is for the following reason: In general, for planarization to eliminate a level difference between a memory (storage) part and a logic part of a semiconductor memory device, a method for performing planarization flow by annealing a BPSG film or a method for performing planarization CMP by annealing a BPSG film is employed. In such a fabrication method, when the ferroelectric film is annealed after forming the upper electrode, the annealing of the ferroelectric film and the annealing of the BPSG film can be simultaneously performed. As a result, the fabrication cost can be reduced.

In any of the sixth through eleventh methods for fabricating a ferroelectric capacitive element, the layer including a group V element and bismuth is preferably made from BiTa, BiPa, BiNb, BiTaO$_x$, BiPaO$_x$ or BiNbO$_x$.

In any of the sixth through eleventh methods for fabricating a ferroelectric capacitive element, out of an upper portion of the lower electrode and a lower portion of the upper electrode, at least the upper portion of the lower electrode is preferably made from a material including the group V element, and the material including the group V element is preferably IrTa, IrPa, IrNb, IrTaO$_x$, IrPaO$_x$ or IrNbO$_x$.

Thus, at least the upper portion of the lower electrode is made from the material including the group V element, and hence, the diffusion of the bismuth from the ferroelectric film through the annealing can be accelerated. Therefore, the bismuth composition in the whole ferroelectric film can be more easily made substantially homogenous in a shorter period of time, and the composition of the ferroelectric film can be accurately controlled. As a result, the ferroelectric film can attain a more sufficient ferroelectric characteristic.

Alternatively, in order to overcome the aforementioned problem, the first ferroelectric capacitive element according to one aspect of the invention includes a lower electrode made of a first conductive film and formed on a substrate; a ferroelectric film including bismuth and formed on the lower electrode; and an upper electrode made of a second conductive film and formed on the ferroelectric film, and the first conductive film is a metal film more easily etched than a platinum film, and a concentration of the bismuth included in the ferroelectric film is substantially uniform along the thickness direction of the ferroelectric film.

In the first ferroelectric capacitive element, since the concentration of the bismuth included in the ferroelectric film obtained after annealing is substantially uniform, the ferroelectric film is free from the composition shift and has a sufficient ferroelectric characteristic. Also, without using a platinum film as in the conventional technique for preventing the composition shift of the ferroelectric film, the metal film more easily dry etched than a platinum film is used, and therefore, the occurrence of a processing defect of the ferroelectric capacitive element is prevented.

The second ferroelectric capacitive element according to one aspect of the invention includes a lower electrode made of a first conductive film and formed on a substrate; a first ferroelectric film including bismuth and formed on the lower electrode; a second ferroelectric film including bismuth and formed on the first ferroelectric film; and an upper electrode made of a second conductive film and formed on the second ferroelectric film, and the first conductive film is a metal film more easily etched than a platinum film, and a concentration of the bismuth included in the first ferroelectric film is substantially equal to a concentration of the bismuth included in the second ferroelectric film.

In the second ferroelectric capacitive element, since the concentration of the bismuth included in the first and second ferroelectric films obtained after annealing is substantially uniform, the ferroelectric film is free from the composition shift and has a sufficient ferroelectric characteristic. Also, without using a platinum film as in the conventional technique for preventing the composition shift of the ferroelectric film, the metal film more easily dry etched than a platinum film is used, and therefore, the occurrence of a processing defect of the ferroelectric capacitive element is prevented.

The third ferroelectric capacitive element according to one aspect of the invention includes a lower electrode made of a first conductive film and formed on a substrate; a ferroelectric film formed on the lower electrode and having a multilayered structure in which each layer includes bismuth; and an upper electrode made of a second conductive film and formed on the ferroelectric film, and the first conductive film is a metal film more easily etched than a platinum film, and concentrations of bismuth included in respective layers of the ferroelectric film are substantially equal to one another.

In the third ferroelectric capacitive element, since the concentrations of the bismuth included in the respective layers of the multilayered structure of the ferroelectric film obtained after annealing are substantially equal to one another, the ferroelectric film is free from the composition shift and has a sufficient ferroelectric characteristic. Also, without using a platinum film as in the conventional technique for preventing the composition shift of the ferroelectric film, the metal film more easily dry etched than a platinum film is used, and therefore, the occurrence of a processing defect of the ferroelectric capacitive element is prevented.

The fourth ferroelectric capacitive element according to one aspect of the invention includes a lower electrode made of a first conductive film and formed on a substrate; a ferroelectric film made of an SBT film or an SBTN film and formed on the lower electrode; and an upper electrode made of a second conductive film and formed on the ferroelectric film, and the first conductive film is a metal film more easily etched than a platinum film, and a bismuth composition ratio in the ferroelectric film is substantially equivalent to a bismuth composition ratio in stoichiometric composition.

In the fourth ferroelectric capacitive element, since the bismuth composition ratio in the ferroelectric film obtained after annealing is substantially equivalent to the bismuth composition ratio in the stoichiometric composition, the ferroelectric film is free from the composition shift and has a sufficient ferroelectric characteristic. Also, without using a platinum film as in the conventional technique for preventing the composition shift of the ferroelectric film, the metal film more easily dry etched than a platinum film is used, and therefore, the occurrence of processing defects of the ferroelectric capacitive element is prevented.

In any of the first through fourth ferroelectric capacitive elements, when the first conductive film is a noble metal oxide film or a multilayered film of a noble metal oxide and a noble metal that is more easily etched than a platinum film, the occurrence of a processing defect of the ferroelectric capacitive element can be prevented.

In any of the first through fourth ferroelectric capacitive elements, when the second conductive film is a noble metal oxide film or a multilayered film of a noble metal oxide and a noble metal that is more easily etched than a platinum film, the occurrence of a processing defect of the ferroelectric capacitive element can be prevented. Furthermore, the second conductive film is more preferably a multilayered film of a noble metal oxide and a noble metal because a problem of operation delay in a fast operation of a transistor can be thus overcome. This is because the sheet resistance can be suppressed to $1/10$ through $1/100$ when the second conductive film is a multilayered film of a noble metal oxide and a noble metal as compared with the case where it is made of a metal oxide film alone.

The fifth ferroelectric capacitive element according to one aspect of the invention includes a lower electrode formed on a substrate; a ferroelectric film made of an SBT film or an SBTN film and formed on the lower electrode; and an upper electrode formed on the ferroelectric film, and out of a portion between the ferroelectric film and the lower electrode and a portion between the ferroelectric film and the upper electrode, a layer including a group V element and bismuth is formed at least in the portion between the ferroelectric film and the lower electrode.

In the fifth ferroelectric capacitive element, the layer including a group V element and bismuth is provided between the ferroelectric film and the lower electrode and between the ferroelectric film and the upper electrode, and the layer including a group V element and bismuth efficiently captures bismuth diffused from the ferroelectric film during the fabrication. Therefore, when the layers having captured the bismuth are analyzed, the amount of bismuth diffused from and going out of the ferroelectric film can be previously grasped, and hence, the ferroelectric film can attain a desired composition. On that point, in the first through fourth ferroelectric capacitive elements, the bismuth diffused from and going out of the ferroelectric film is not captured but reaches the side of the lower electrode or the upper electrode, and hence, it is not easy to predict the amount of bismuth diffused from and going out of the ferroelectric film. Therefore, in these elements, the control of the composition of the ferroelectric film is unavoidably unstable. In contrast, in the fifth element, the composition of the ferroelectric film can be more accurately controlled, so that the ferroelectric capacitive element can attain a good ferroelectric characteristic. Also, without using a platinum film as in the conventional technique for preventing the composition shift of the ferroelectric film, the metal film more easily dry etched than a platinum film is used as the lower electrode and the upper electrode, so that the occurrence of a processing defect of the ferroelectric capacitive element can be prevented.

In the fifth ferroelectric capacitive element, the layer including a group V element and bismuth is preferably made from BiTa, BiPa, BiNb, $BiTaO_x$, $BiPaO_x$ or $BiNbO_x$.

In the fifth ferroelectric capacitive element, out of an upper portion of the lower electrode and a lower portion of the upper electrode, at least the upper portion of the lower electrode is preferably made from a material including the group V element.

In the fifth ferroelectric capacitive element, the material including the group V element is preferably IrTa, IrPa, IrNb, $IrTaO_x$, $IrPaO_x$ or $IrNbO_x$.

In the fifth ferroelectric capacitive element, a concentration of bismuth included in the ferroelectric film is substantially uniform.

As described so far, in the method for fabricating a ferroelectric capacitive element of this invention, since the bismuth concentration in the ferroelectric film is adjusted so that the bismuth composition becomes substantially homogeneous in the ferroelectric film after the bismuth is diffused from the first ferroelectric film to the lower electrode or the upper electrode through the annealing, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film can be used, and therefore, the occurrence of a processing defect of the ferroelectric capacitive element, which derives from generation of particles or the like occurring during dry etching, can be prevented. Moreover, since the layer including the group V element and bismuth is formed between the ferroelectric film and the lower electrode or between the ferroelectric film and the upper electrode, the bismuth diffused from the ferroelectric film can be efficiently captured. Therefore, when the layer having captured the bismuth is analyzed, the amount of bismuth diffused from and going out of the ferroelectric film can be previously grasped, and hence, the composition of the ferroelectric film can be more effectively controlled. Furthermore, when the annealing is performed after forming the upper electrode, the semiconductor fabrication process cost can be reduced. This is for the following reason: In general, for planarization to eliminate a level difference between a memory (storage) part and a logic part of a semiconductor memory device, a method for performing planarization flow by annealing a BPSG film or a method for performing planarization CMP by annealing a BPSG film is employed. In such a fabrication method, when the ferroelectric film is annealed after forming the upper electrode, the annealing of the ferroelectric film and the annealing of the BPSG film can be simultaneously performed. As a result, the fabrication cost can be reduced.

Alternatively, in the ferroelectric capacitive element of this invention, since the bismuth concentration in the ferroelectric film obtained after annealing is substantially homogeneous, the composition shift is prevented, so that the ferroelectric film can attain a sufficient ferroelectric characteristic. Also, without using a platinum film as in the conventional technique for preventing the composition shift of the ferroelectric film, the metal film more easily dry etched than a platinum film is used, and therefore, the occurrence of a processing defect of the ferroelectric capacitive element, which derives from generation of particles or the like occurring during dry etching, can be prevented. Moreover, since the layer including the group V element and bismuth is formed between the ferroelectric film and the lower electrode or between the ferroelectric film and the upper electrode, the bismuth diffused from the ferroelectric film can be efficiently captured by the layer including the group V element and the bismuth. Therefore, when the layer having captured the bismuth is analyzed, the amount of bismuth diffused from and going out of the ferroelectric film can be previously grasped, and hence, the composition of the ferroelectric film can be more effectively controlled. As a result, the ferroelectric capacitive element can attain a good ferroelectric characteristic.

DETAILED DESCRIPTION OF THE INVENTION

Preferred embodiments of the invention will now be described with reference to the accompanying drawings.

Embodiment 1

Now, a semiconductor device including a ferroelectric capacitive element according to Embodiment 1 of the invention will be described with reference to FIG. 1.

Figure 1:
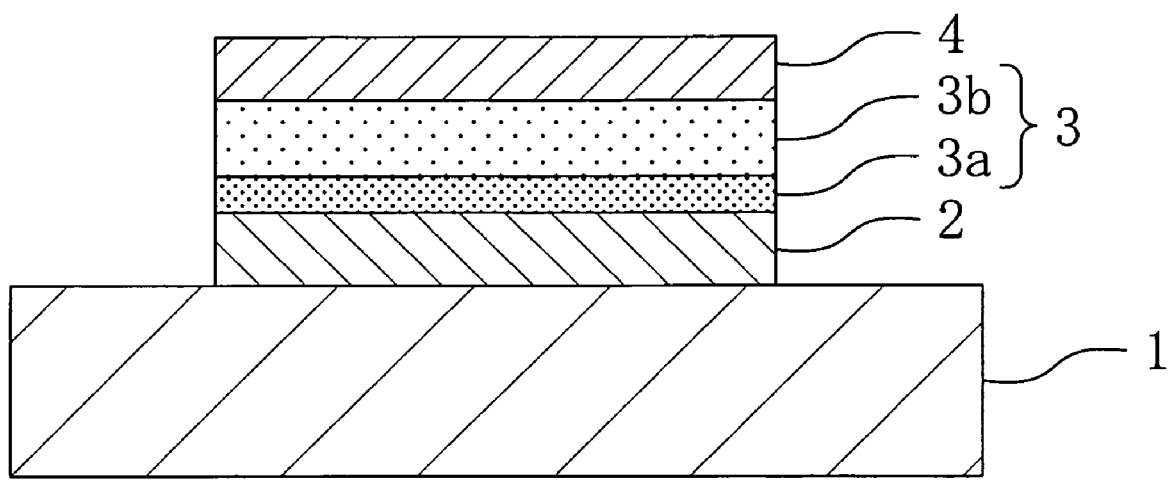
FIG. 1 is a cross-sectional view of a principal part of a semiconductor device including a ferroelectric capacitive element according to Embodiment 1 of the invention.

FIG. 1 is a cross-sectional view for showing the structure of a principal part of the semiconductor device including the ferroelectric capacitive element of Embodiment 1.

As shown in FIG. 1, a MOS transistor (not shown) for providing a function as a semiconductor memory device to the semiconductor device is formed on a substrate 1 made of a semiconductor substrate of monosilicon or the like or an insulating substrate of quartz or the like. It is noted that a semiconductor thin film such as a polysilicon film, an amorphous silicon film, a $SiO_2$ film or a silicon nitride film, an aluminum interconnect layer or a Cu interconnect layer may be formed on the substrate 1.

A lower electrode 2 made of a metal film more easily etched than a platinum film, such as a noble metal oxide film or a multilayered film of a noble metal oxide and a noble metal, having a thickness of 75 through 150 nm is formed on the substrate 1. As the noble metal oxide, $IrO_x$, $PdO_x$, $RhO_x$ or the like can be used, and as the multilayered film of a noble metal oxide and a noble metal, an $Ir/IrO_x$ film, a $Pd/PdO_x$ film, a $Rh/RhO_x$ film or the like can be used. A ferroelectric capacitor dielectric film 3 having a multilayered structure including a first ferroelectric film 3a including bismuth and a second ferroelectric film 3b including bismuth stacked in this order in the upward direction is formed on the lower electrode 2. The thickness of the second ferroelectric film 3b is larger than that of the first ferroelectric film 3a, and the concentration of bismuth in the first ferroelectric film 3a is higher than that in the second ferroelectric film 3b.

Furthermore, an upper electrode 4 made of a metal film more easily etched than a platinum film, such as a noble metal oxide film or a multilayered film of a noble metal oxide and a noble metal, having a thickness of 75 through 150 nm is formed on the second ferroelectric film 3b. As the noble metal oxide, $IrO_x$, $PdO_x$, $RhO_x$ or the like can be used, and as the multilayered film of a noble metal oxide and a noble metal, an $Ir/IrO_x$ film, a $Pd/PdO_x$ film, a $Rh/RhO_x$ film or the like can be used. The upper electrode 4 is preferably made of a multilayered film of a noble metal oxide and a noble metal because a problem of operation delay in a fast operation of a transistor can be thus overcome. This is because the sheet resistance can be suppressed to $\frac{1}{10}$ through $\frac{1}{100}$ when the upper electrode 4 is made of a multilayered film of a noble metal oxide and a noble metal as compared with the case where it is made of a metal oxide film alone. In this manner, a ferroelectric capacitive element composed of the lower electrode 2, the ferroelectric capacitor dielectric film 3 and the upper electrode 4 is formed.

Next, a method for fabricating the semiconductor device including the ferroelectric capacitive element according to Embodiment 1 will be described with reference to FIGS. 2A through 2D.

FIGS. 2A through 2D are cross-sectional views for showing procedures in the method for fabricating the principal part of the semiconductor device including the ferroelectric capacitive element of Embodiment 1.

Figure 2A:
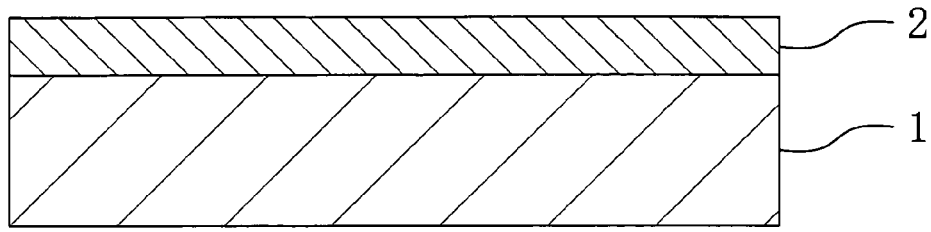
FIGS. 2A, 2B, 2C and 2D are cross-sectional views for showing procedures in a method for fabricating the principal part of the semiconductor device including the ferroelectric capacitive element of Embodiment 1.

First, as shown in FIG. 2A, a MOS transistor not shown is formed on the substrate 1 made of a semiconductor substrate of monosilicon or the like or an insulating substrate of quartz or the like so that the semiconductor device can be used as a semiconductor memory device. It is noted that a semiconductor thin film such as a polysilicon film, an amorphous silicon film, a $SiO_2$ film or a silicon nitride film, an aluminum interconnect layer or a Cu interconnect layer may be formed on the substrate 1. Next, the lower electrode 2 made of a metal film more easily etched than a platinum film, such as a noble metal oxide film or a multilayered film of a noble metal oxide and a noble metal, having a thickness of 75 through 150 nm is formed on the substrate 1. As the metal oxide, $IrO_x$, $PdO_x$, $RhO_x$ or the like can be used, and as the multilayered film of a noble metal oxide and a noble metal, an $Ir/IrO_x$ film, a $Pd/PdO_x$ film, a $Rh/RhO_x$ film or the like can be used.

Figure 2B:
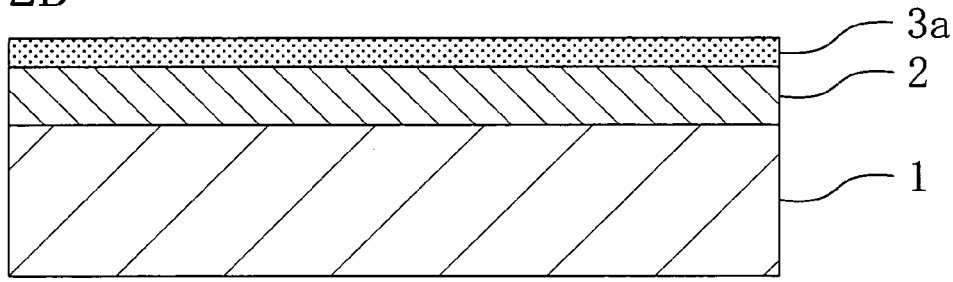

Next, as shown in FIG. 2B, the first ferroelectric film 3a with a thickness of 20 through 80 nm is formed on the lower electrode 2 by MOCVD, MOD or sputtering. The growth temperature employed for forming the first ferroelectric film 3a is room temperature through 300° C. In a general SBT film, the composition ratio among the respective elements, that is, strontium (Sr):bismuth (Bi):tantalum (Ta):oxygen (O), is 1:2:2:9, which is substantially equivalent to the stoichiometric composition ratio. However, the concentration of bismuth is high in the first ferroelectric film 3a, so that the composition ratio of bismuth in the first ferroelectric film 3a can be higher than the composition ratio of bismuth in the stoichiometric composition ratio. Specifically, the composition concentration ratio of the bismuth is preferably 1.1 through 3.5 times as high as that of the strontium.

Figure 2C:
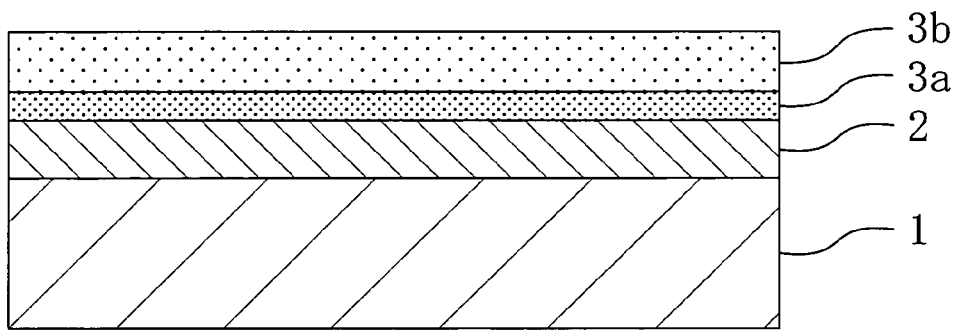

Next, as shown in FIG. 2C, the second ferroelectric film 3b with a thickness of 50 through 180 nm is formed on the first ferroelectric film 3a by the MOCVD, the MOD or the sputtering. The growth temperature employed for forming the second ferroelectric film 3a is room temperature through 300° C. in forming the second ferroelectric film 3b. Also, the composition ratio of the second ferroelectric film 3b, that is, strontium (Sr):bismuth (Bi):tantalum (Ta):oxygen (O), is 1:2:2:9, which is substantially equivalent to the stoichiometric composition ratio.

Then, the first ferroelectric film 3a and the second ferroelectric film 3b are sintered by using a diffusion furnace or an RTA. This annealing is performed in an $O_2$ atmosphere or an $O_3$ atmosphere at 600 through 850° C. for 10 through 30 minutes in using the diffusion furnace and at 650 through 900° C. for 20 through 120 seconds in using the RTA. The annealing may be performed respectively after forming the first ferroelectric film 3a in the procedure shown in FIG. 2B and after forming the second ferroelectric film 3b in the procedure shown in FIG. 2C. Thus, the composition of bismuth can be easily made homogeneous in the whole of the first ferroelectric film 3a and the second ferroelectric film 3b, and hence, the ferroelectric film 3 can attain a sufficient ferroelectric characteristic.

Figure 2D:
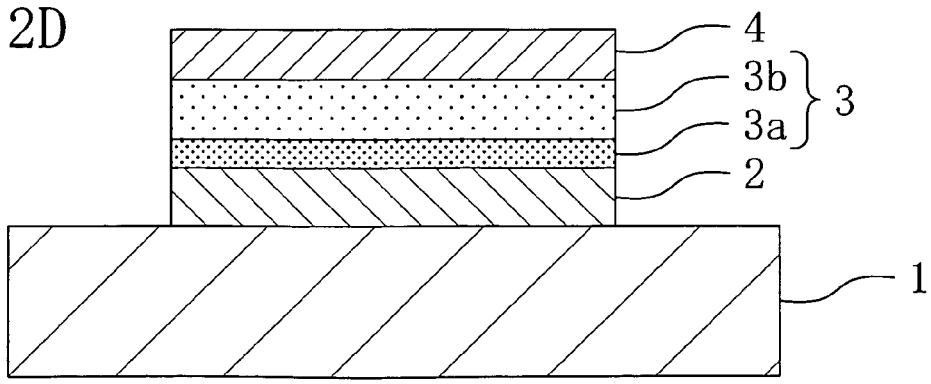

Next, as shown in FIG. 2D, an upper electrode 4 made of a metal film more easily etched than a platinum film, such as a noble metal oxide film or a multilayered film of a noble metal oxide and a noble metal, having a thickness of 75 through 150 nm is formed on the second ferroelectric film 3b by the sputtering or the like. As the noble metal oxide, $IrO_x$, $PdO_x$, $RhO_x$ or the like can be used, and as the multilayered film of a noble metal oxide and a noble metal, an $Ir/IrO_x$ film, a $Pd/PdO_x$ film, a $Rh/RhO_x$ film or the like can be used. Preferably, the upper electrode 4 is made of a multilayered film of a noble metal oxide and a noble metal because a problem of operation delay in a fast operation of a transistor can be thus overcome. This is because the sheet resistance can be suppressed to $\frac{1}{10}$ through $\frac{1}{100}$ when the upper electrode 4 is made of a multilayered film of a noble metal oxide and a noble metal as compared with the case where it is made of a metal oxide film alone. Subsequently, the lower electrode 2, the ferroelectric film 3 composed of the first ferroelectric film 3a and the second ferroelectric film 3b, and the upper electrode 4 are patterned by dry etching, thereby forming the ferroelectric capacitive element.

In this manner, the ferroelectric capacitive element included in the semiconductor device is fabricated.

Now, the reason why the composition shift of the ferroelectric film can be prevented by preventing out diffusion occurring in annealing of a ferroelectric composite included in the ferroelectric film and the occurrence of a defect can be prevented in the refinement processing of the structure of the semiconductor device including the ferroelectric capacitive element and the fabrication method for the same according to Embodiment 1 of the invention will be described.

Figure 3A:
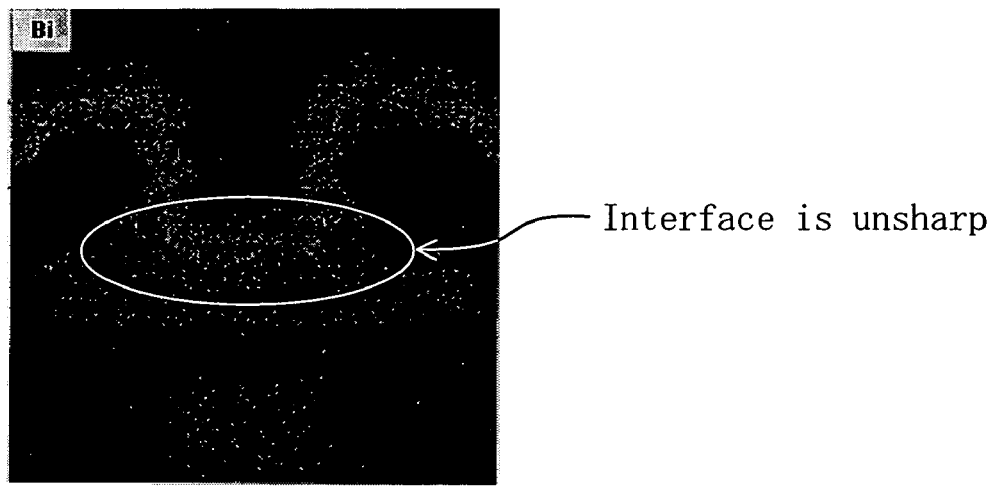
FIGS. 3A and 3B are diagrams for showing an EDS analysis result obtained in an SBT film after annealing in Embodiment 1.
Figure 3B:
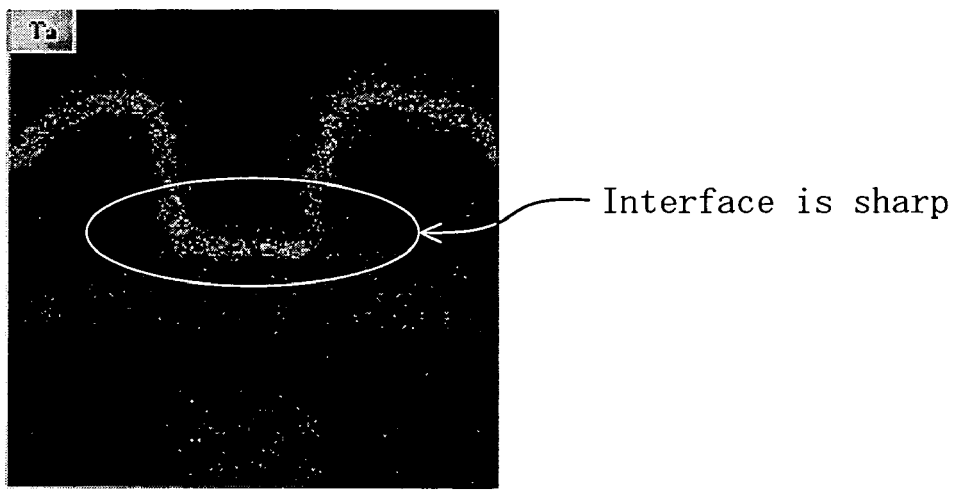

First, it has been found through an experiment that bismuth included in a ferroelectric film tends to diffuse in the annealing of the ferroelectric film as follows:

FIGS. 3A and 3B show the results of EDS analysis performed after annealing of a ferroelectric film made of an SBT film. In FIGS. 3A and 3B, the EDS analysis is performed on an SBT film used in a vertical capacitor composed of a lower electrode, the SBT film and an upper electrode successively formed in a recess.

It has been found that the interface of bismuth is unsharp as is obvious from FIG. 3A and that the interface of tantalum is sharp as is obvious from FIG. 3B as compared with that of the bismuth shown in FIG. 3A. Such a difference is caused because the bismuth diffuses outward from the SBT film through the annealing. In this manner, the ferroelectric polarization characteristic is degraded owing to the out diffusion of the bismuth.

Accordingly, when the concentration of bismuth in the first ferroelectric film 3a disposed in the lower portion of the ferroelectric film 3 of this embodiment is higher than the concentration of bismuth in the second ferroelectric film 3b, even after the bismuth is diffused from the first ferroelectric film 3a to the lower electrode 2 through the annealing, the ferroelectric film 3 can attain a desired SBT composition ratio free from the degradation of the ferroelectric polarization characteristic.

Furthermore, when the ferroelectric film 3 has the aforementioned structure, there is no need to use a platinum film difficult to be dry etched for preventing the composition shift of the ferroelectric film 3 as in the conventional technique. Therefore, the occurrence of a processing defect of the ferroelectric capacitive element derived from peeling off a platinum film in the dry etching can be prevented. Specifically, in this embodiment, a metal film more easily dry etched than a platinum film, such as a noble metal oxide film or a multilayered film of a noble metal oxide and a noble metal, can be used as the lower electrode 2, and therefore, a processing defect of the ferroelectric capacitive element does not occur. In addition, in this case, the composition shift of the ferroelectric film 3 can be prevented without using a platinum film.

Figure 4:
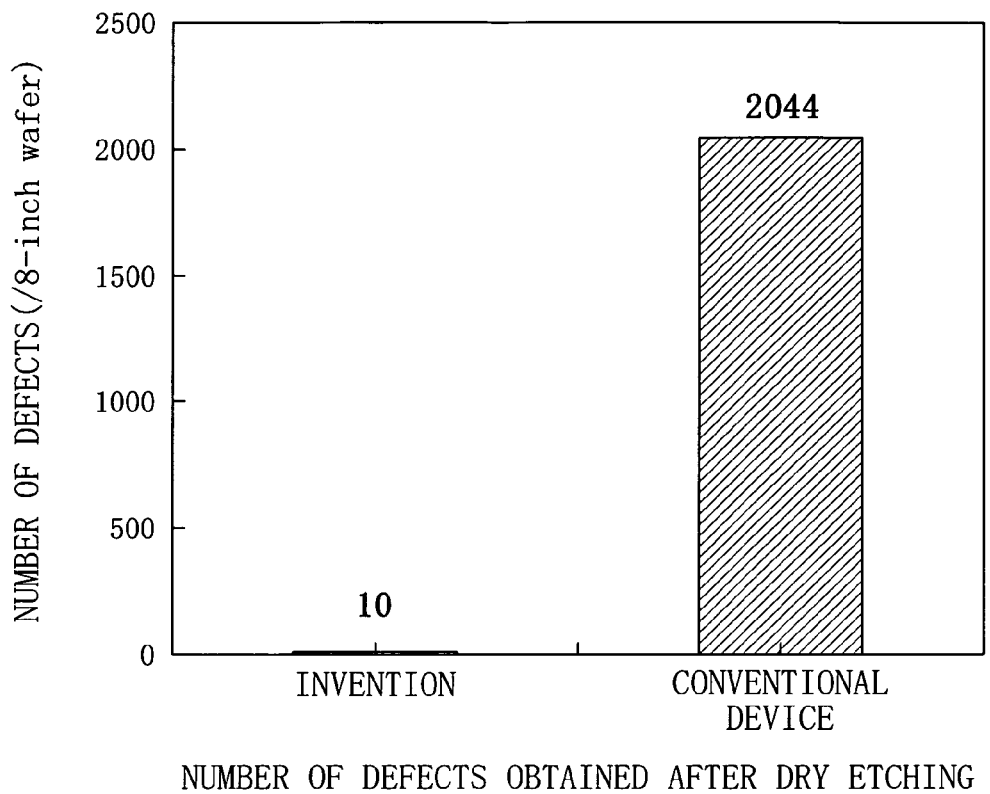
FIG. 4 is a graph for showing the number of processing defects caused in the ferroelectric capacitive element of Embodiment 1.

FIG. 4 is a graph for comparing the number of processing defects occurring in the ferroelectric capacitive element of this embodiment with the number of processing defects occurring in a conventional ferroelectric capacitive element.

It is noted that FIG. 4 shows the number of processing defects obtained through inspection using a pattern defect detecting system (manufactured by KLA-Tencor; KLA2139). Also, the number of defects of the conventional ferroelectric capacitive element shown in FIG. 4 is obtained in a wafer in which a multilayered structure pattern including a conductive ceramic film and a platinum thin film is dry etched.

As shown in FIG. 4, the number of defects of the conventional ferroelectric capacitive element obtained after the dry etching is 2044 (/8-inch wafer) while that of the ferroelectric capacitive element of this embodiment obtained after the dry etching is 10 (/8-inch wafer). Thus, the number of processing defects is remarkably reduced.

Figure 5:
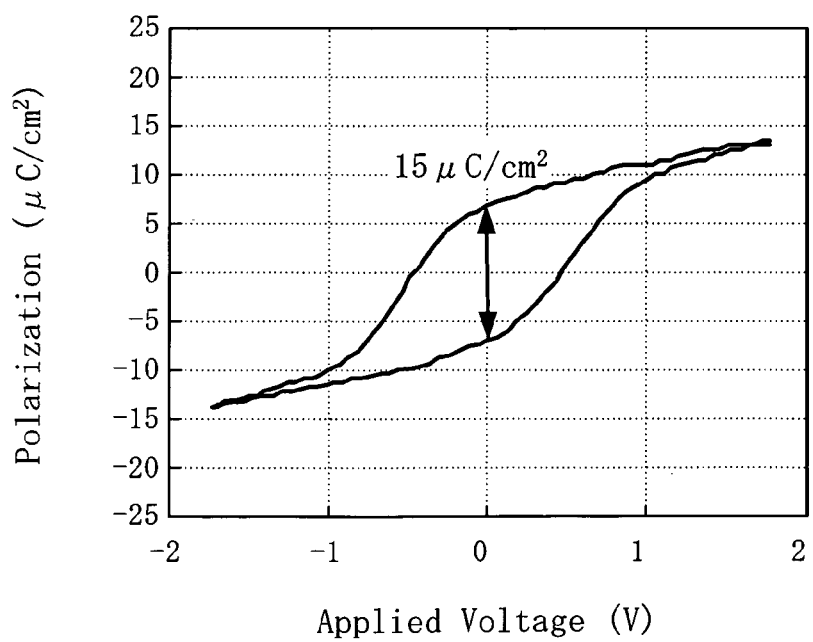
FIG. 5 is a graph for showing the polarization characteristic of the ferroelectric capacitive element obtained after the annealing of Embodiment 1.

FIG. 5 is a graph for showing the polarization characteristic of the ferroelectric capacitive element of this embodiment obtained after the annealing.

As is obvious from FIG. 5, the ferroelectric capacitive element of this embodiment attains the ferroelectric polarization characteristic of 15 $\mu C/cm^2$. In other words, the ferroelectric capacitive element of this embodiment attains, after the annealing, a sufficient polarization characteristic to be used as a ferroelectric capacitive element of a semiconductor device.

As described so far, according to Embodiment 1 of the invention, since the concentration of bismuth in the first ferroelectric film 3a disposed in the lower portion of the ferroelectric film 3 is higher than that in the second ferroelectric film 3b, even after the bismuth is diffused from the first ferroelectric film 3a to the lower electrode 2 through the annealing, the bismuth composition is substantially homogenous in the whole of the first ferroelectric film 3a and the second ferroelectric film 3b. Therefore, the ferroelectric film 3 having a desired SBT composition ratio free from the degradation of the ferroelectric polarization characteristic can be obtained. Also, since the ferroelectric film 3 has the aforementioned structure, the metal film more easily dry etched than a platinum film can be used as the electrode without using a platinum film for preventing the composition shift of the ferroelectric film 3. Therefore, the occurrence of a processing defect of the ferroelectric element can be prevented.

Although the ferroelectric film 3 has the two-layered structure including the first ferroelectric film 3a and the second ferroelectric film 3b in the above description, the ferroelectric film 3 may have a single-layered structure. In this case, the ferroelectric film is formed so that the concentration of bismuth therein may have inclined gradient along the thickness direction of the ferroelectric film so as to reduce from the side of the lower electrode to the side of the upper electrode. The ferroelectric film having the inclined gradient in which the concentration of the bismuth is reduced from the side of the lower electrode to the side of the upper electrode can be formed by, for example, adjusting the amount of bismuth while allowing a gas including bismuth to continuously flow. Thus, the same effect as that described above can be attained, and in addition, since the inclined gradient of the concentration of bismuth can be more finely caused, the bismuth composition in the whole ferroelectric film can be more easily made homogenous. As a result, the ferroelectric film can attain a more sufficient ferroelectric characteristic.

Alternatively, the ferroelectric film 3 may have a multilayered structure in which each layer includes bismuth. In this case, the respective layers included in the ferroelectric film are formed so that the concentrations of bismuth included therein are gradually reduced from the side of the lower electrode to the side of the upper electrode. For example, when a gas including a desired amount of bismuth is allowed to flow in forming each layer of the ferroelectric film, the concentrations of bismuth included in the respective layers are gradually reduced from the side of the lower electrode to the side of the upper electrode in the ferroelectric film. In this manner, the same effect as that described above can be attained, and in addition, since the inclined gradient of the concentration of bismuth can be more finely adjusted, the bismuth composition in the whole ferroelectric film can be more easily made substantially homogeneous. As a result, the ferroelectric film can attain a more sufficient ferroelectric characteristic.

Although the SBT film is used as the ferroelectric film 3 in this embodiment, the same effect can be attained even when another Bi-based layered perovskite type ferroelectric thin film such as an SBTN film or a BLT film is used.

Embodiment 2

A semiconductor device including a ferroelectric capacitive element according to Embodiment 2 of the invention will now be described with reference to FIG. 6.

Figure 6:
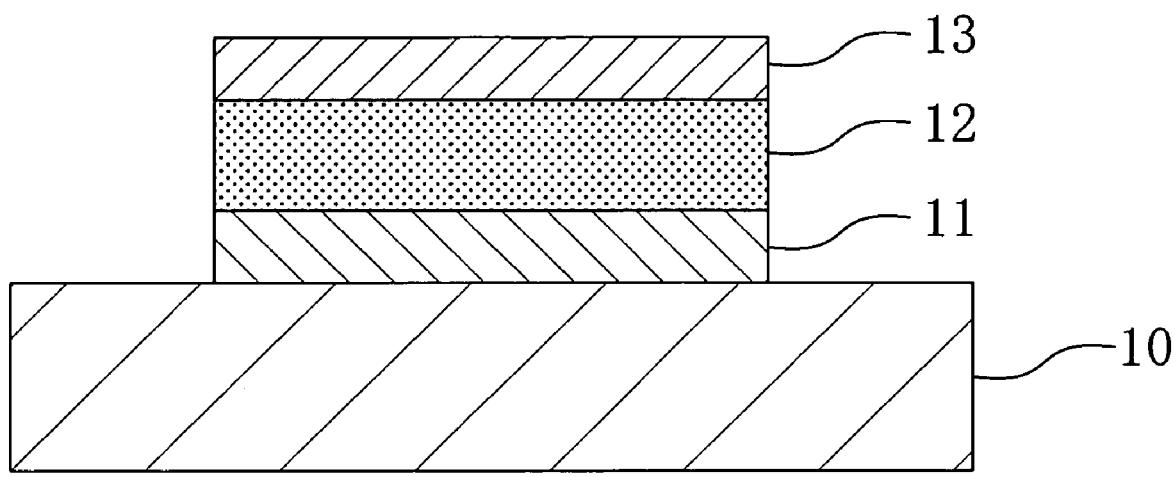
FIG. 6 is a cross-sectional view of a principal part of a semiconductor device including a ferroelectric capacitive element according to Embodiment 2 of the invention.

FIG. 6 is a cross-sectional view for showing the structure of a principal part of the semiconductor device including the ferroelectric capacitive element of Embodiment 2.

As shown in FIG. 6, a MOS transistor (not shown) for providing a function as a semiconductor memory device to the semiconductor device is formed on a substrate 10 made of a semiconductor substrate of monosilicon or the like or an insulating substrate of quartz or the like. It is noted that a semiconductor thin film such as a polysilicon film, an amorphous silicon film, a $SiO_2$ film or a silicon nitride film, an aluminum interconnect layer or a Cu interconnect layer may be formed on the substrate 10.

On the substrate 10, a lower electrode 11 made of a metal film more easily dry etched than a platinum film, such as a noble metal oxide film or a multilayered film of a noble metal oxide and a noble metal, having a thickness of 75 through 150 nm is formed. As the noble metal oxide, $IrO_x$, $PdO_x$, $RhO_x$ or the like can be used, and as the multilayered film of a noble metal oxide and a noble metal, an $Ir/IrO_x$ film, a $Pd/PdO_x$ film, a $Rh/RhO_x$ film or the like can be used.

A ferroelectric film 12 having a concentration profile with a high bismuth concentration is formed on the lower electrode 11. Specifically, in consideration of the out diffusion of bismuth caused in annealing of the ferroelectric film 12, the bismuth composition ratio in the ferroelectric film 12 is set to be higher than in the stoichiometric composition ratio, that is, Sr:Bi:Ta:O=1:2:2:9, so that the ferroelectric film 12 can attain a composition ratio substantially equivalent to the stoichiometric composition (i.e., Sr:Bi:Ta:O=1:2:2:9) after the annealing.

An upper electrode 13 made of a metal film more easily dry etched than a platinum film, such as a noble metal oxide film or a multilayered film of a noble metal oxide and a noble metal, having a thickness of 75 through 150 nm is formed on the ferroelectric film 12. As the noble metal oxide, $IrO_x$, $PdO_x$, $RhO_x$ or the like can be used, and as the multilayered film of a noble metal oxide and a noble metal, an $Ir/IrO_x$ film, a $Pd/PdO_x$ film, a $Rh/RhO_x$ film or the like can be used. The upper electrode 13 is preferably made of a multilayered film of a noble metal oxide and a noble metal because a problem of operation delay in a fast operation of a transistor can be thus overcome. This is because the sheet resistance can be suppressed to $1/10$ through $1/100$ when the upper electrode 13 is made of a multilayered film of a noble metal oxide and a noble metal as compared with the case where it is made of a metal oxide film alone. In this manner, a ferroelectric capacitive element composed of the lower electrode 11, the ferroelectric capacitor dielectric film 12 and the upper electrode 13 is formed.

Next, a method for fabricating the semiconductor device including the ferroelectric capacitive element according to Embodiment 2 will be described with reference to FIGS. 7A through 7D.

FIGS. 7A through 7D are cross-sectional views for showing procedures in a method for fabricating the principal part of the semiconductor device including the ferroelectric capacitive element of Embodiment 2.

Figure 7A:
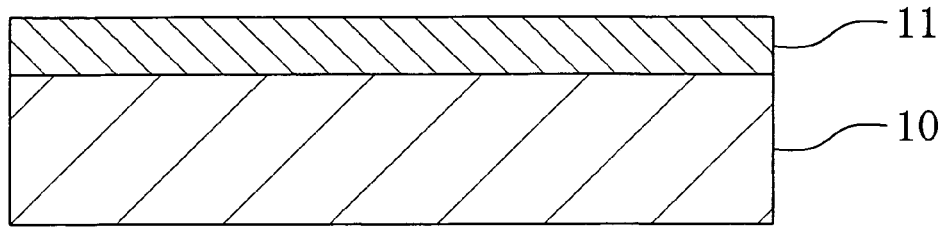
FIGS. 7A, 7B, 7C and 7D are cross-sectional views for showing procedures in a method for fabricating the principal part of the semiconductor device including the ferroelectric capacitive element of Embodiment 2.

First, as shown in FIG. 7A, a MOS transistor not shown is formed on the substrate 10 made of a semiconductor substrate of monosilicon or the like or an insulating substrate of quartz or the like so that the semiconductor device can be used as a semiconductor memory device. It is noted that a semiconductor thin film such as a polysilicon film, an amorphous silicon film, a $SiO_2$ film or a silicon nitride film, an aluminum interconnect layer or a Cu interconnect layer may be formed on the substrate 10. Next, a lower electrode 11 made of a metal film more easily etched than a platinum film, such as a noble metal oxide film or a multilayered film of a noble metal oxide and a noble metal, having a thickness of 75 through 150 nm is formed on the substrate 10. As the metal oxide, $IrO_x$, $PdO_x$, $RhO_x$ or the like can be used, and as the multilayered film of a noble metal oxide and a noble metal, an $Ir/IrO_x$ film, a $Pd/PdO_x$ film, a $Rh/RhO_x$ film or the like can be used.

Figure 7B:
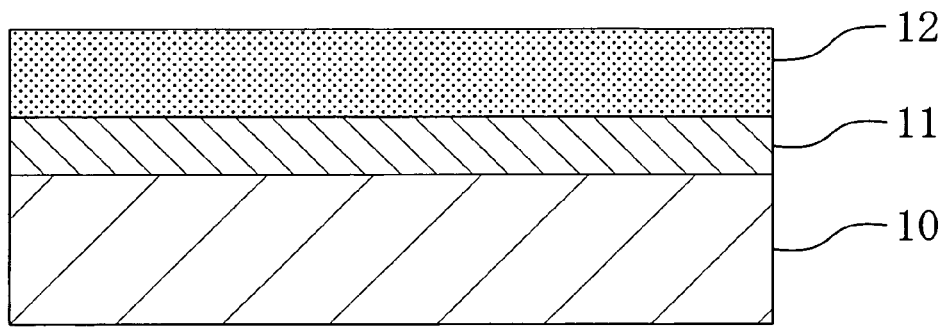

Next, as shown in FIG. 7B, the ferroelectric film 12 with a thickness of 50 through 150 nm is formed on the lower electrode 11 by the MOCVD, the MOD or the sputtering. The growth temperature employed for forming the ferroelectric film 12 is room temperature through 300° C. Also, in consideration of the out diffusion of bismuth caused in annealing of the ferroelectric film 12, the composition ratio of bismuth in the ferroelectric film 12 is set to be higher than in the stoichiometric composition ratio, that is, Sr:Bi:Ta: O=1:2:2:9, so that the composition ratio of bismuth in the ferroelectric film 12 can be substantially equivalent to that in the stoichiometric composition ratio (i.e., Sr:Bi:Ta:O=1:2: 2:9) after the annealing. Specifically, the composition concentration ratio of the bismuth is preferably 1.1 through 3.5 times as high as that of the strontium.

Figure 7C:
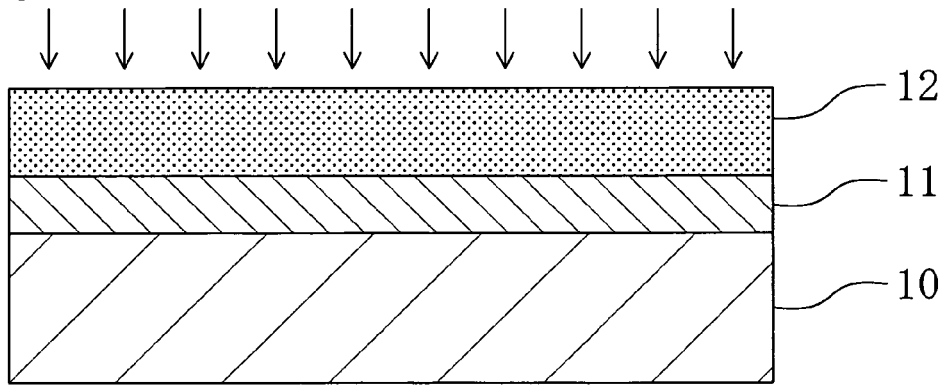

Next, as shown in FIG. 7C, the ferroelectric film 12 is sintered by using a diffusion furnace or an RTA. This annealing is performed in an $O_2$ atmosphere or an $O_3$ atmosphere at 600 through 850° C. for 10 through 30 minutes in using the diffusion furnace and at 650 through 900° C. for 20 through 120 seconds in using the RTA. Although the out diffusion of bismuth is caused in the ferroelectric film 12 through this annealing, since the ferroelectric film 12 includes the bismuth in a composition ratio higher than in the stoichiometric composition ratio (i.e., Sr:Bi:Ta:O=1:2:2:9) as described above, the composition ratio of the ferroelectric film 12 becomes substantially equivalent to the stoichiometric composition ratio, that is, Sr:Bi:Ta:O=1:2:2:9 through this annealing, and thus, the desired composition ratio can be attained.

Figure 7D:
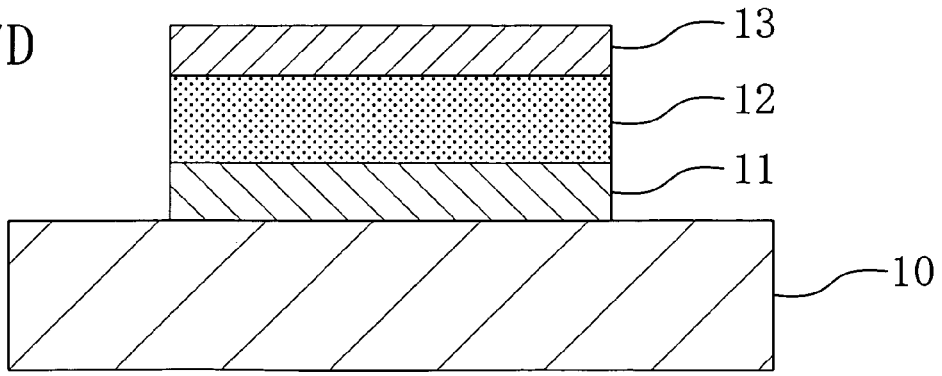

Next, as shown in FIG. 7D, an upper electrode 13 made of a metal film more easily etched than a platinum film, such as a noble metal oxide film or a multilayered film of a noble metal oxide and a noble metal, having a thickness of 75 through 150 nm is formed on the ferroelectric film 12 by the sputtering or the like. As the noble metal oxide, $IrO_x$, $PdO_x$, $RhO_x$ or the like can be used, and as the multilayered film of a noble metal oxide and a noble metal, an $Ir/IrO_x$ film, a $Pd/PdO_x$ film, a $Rh/RhO_x$ film or the like can be used. Preferably, the upper electrode 13 is made of a multilayered film of a noble metal oxide and a noble metal because a problem of operation delay in a fast operation of a transistor can be thus overcome. This is because the sheet resistance can be suppressed to $1/10$ through $1/100$ when the upper electrode 13 is made of a multilayered film of a noble metal oxide and a noble metal as compared with the case where it is made of a metal oxide film alone. Subsequently, the lower electrode 11, the ferroelectric film 12 and the upper electrode 13 are patterned by the dry etching, thereby forming the ferroelectric capacitive element.

Figure 8:
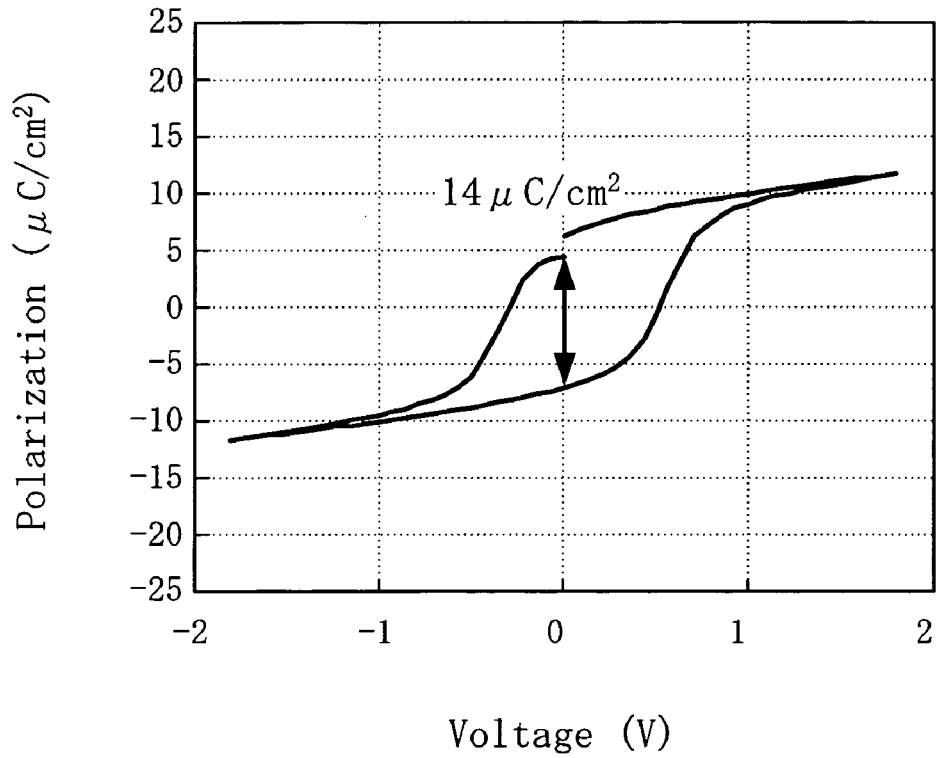
FIG. 8 is a graph for showing the polarization characteristic of the ferroelectric capacitive element obtained after annealing of Embodiment 2.

FIG. 8 is a graph for showing the polarization characteristic of the ferroelectric capacitive element of this embodiment obtained after the annealing.

As is obvious from FIG. 8, the ferroelectric capacitive element of this embodiment attains the ferroelectric polarization characteristic of 14 $\mu C/cm^2$. In other words, the ferroelectric capacitive element of this embodiment attains, after the annealing, a sufficient polarization characteristic to be used as a ferroelectric capacitive element of a semiconductor device.

As described so far, according to Embodiment 2 of the invention, the bismuth composition ratio in the ferroelectric film 12 is previously set to be higher than in the stoichiometric composition ratio (i.e., Sr:Bi:Ta:O=1:2:2:9) so that the composition ratio in the ferroelectric film 12 attained after the annealing can be substantially equivalent to the stoichiometric composition ratio (i.e., Sr:Bi:Ta:O=1:2:2:9). Therefore, even after the bismuth diffuses from the ferroelectric film 12 to the lower electrode 11 through the annealing, the bismuth composition is substantially homogeneous in the ferroelectric film 12, and therefore, the ferroelectric film 12 having a desired SBT composition ratio free from the degradation of the ferroelectric polarization characteristic can be obtained. Also, when the ferroelectric film 12 has the aforementioned structure, the metal film more easily dry etched than a platinum film can be used as the electrode without using a platinum film for preventing the composition shift of the ferroelectric film 12, and therefore, the occurrence of a processing defect of the ferroelectric element can be prevented.

Although the SBT film is used as the ferroelectric film 12 in this embodiment, the same effect can be attained even when another Bi-based layered perovskite type ferroelectric thin film, such as an SBTN film or a BLT film, is used.

Embodiment 3

A semiconductor device including a ferroelectric capacitive element according to Embodiment 3 of the invention will now be described with reference to FIG. 9.

Figure 9:
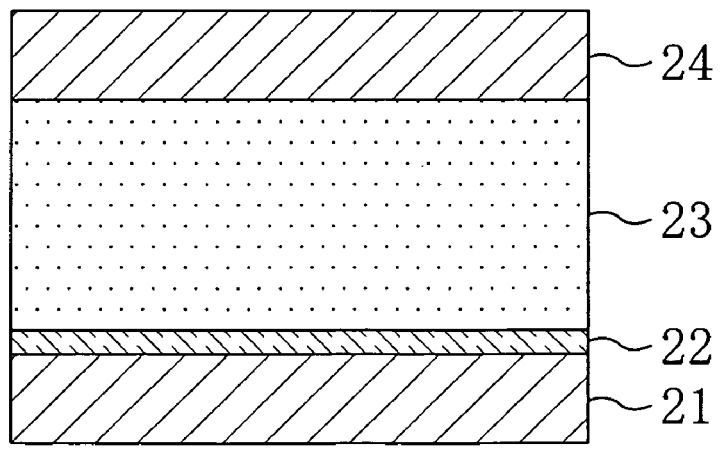
FIG. 9 is a cross-sectional view of a principal part of a ferroelectric capacitive element according to Embodiment 3 of the invention.

FIG. 9 is a cross-sectional view for showing the structure of a principal part of the ferroelectric capacitive element of Embodiment 3.

As shown in FIG. 9, a lower electrode 21 is formed on a substrate (not shown) made of a semiconductor substrate of monosilicon or the like or an insulating substrate of quartz or the like. A material used for forming the lower electrode 21 includes a group V element, and the lower electrode 21 is made from, for example, IrTa, IrPa, IrNb, $IrTaO_x$, $IrPaO_x$ or $IrNbO_x$. Also, the lower electrode 21 preferably has a thickness of 100 through 500 nm, and the material including the group V element may be used merely in an upper portion with a thickness of 50 through 100 nm of the lower electrode 21. It is noted that a MOS transistor for providing a function as a semiconductor memory device to the semiconductor device is formed on the substrate, and a semiconductor thin film such as a polysilicon film, an amorphous silicon film, a $SiO_2$ film or a silicon nitride film, an aluminum interconnect layer or a Cu interconnect layer may be formed on the substrate.

Furthermore, a layer 22 including the group V element and bismuth is formed on the lower electrode 21. The layer 22 including the group V element and bismuth is made from BiTa, BiPa, BiNb, $BiTaO_x$, $BiPaO_x$ or $BiNbO_x$.

Moreover, a ferroelectric film 23 of an SBT film or an SBTN film is formed on the layer 22 including the group V element and bismuth.

An upper electrode 24 is formed on the ferroelectric film 23, and the upper electrode 24 may be made of a generally used platinum film.

Now, a method for fabricating the semiconductor device including the ferroelectric capacitive element of Embodiment 3 will be described with reference to FIGS. 10A through 10D.

FIGS. 10A through 10D are cross-sectional views for showing procedures in a method for fabricating the principal part of the ferroelectric capacitive element of Embodiment 3.

Figure 10A:
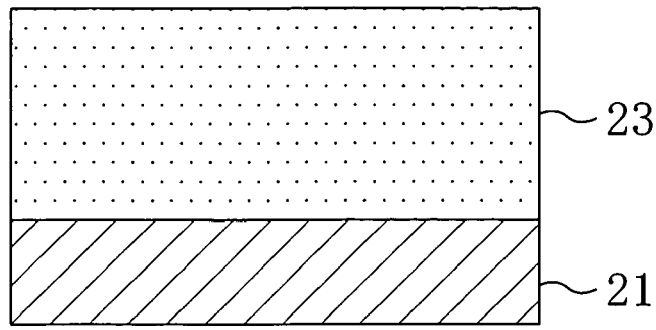
FIGS. 10A, 10B, 10C and 10D are cross-sectional views for showing procedures in a method for fabricating the principal part of the ferroelectric capacitive element of Embodiment 3.

First, as shown in FIG. 10A, the lower electrode 21 is formed on the substrate (not shown). A material used for forming the lower electrode 21 includes a group V element, and the lower electrode 21 is made from, for example, IrTa, IrPa, IrNb, $IrTaO_x$, $IrPaO_x$ or $IrNbO_x$. Also, the lower electrode 21 preferably has a thickness of 100 through 500 nm, and the material including the group V element may be used merely in an upper portion with a thickness of 50 through 100 nm of the lower electrode 21. It is noted that a MOS transistor for providing a function as a semiconductor memory device to the semiconductor device is formed on the substrate, and a semiconductor thin film such as a polysilicon film, an amorphous silicon film, a $SiO_2$ film or a silicon nitride film, an aluminum interconnect layer or a Cu interconnect layer may be formed on the substrate.

Next, the ferroelectric film 23 is formed on the lower electrode 21 by the MOCVD, the MOD or the sputtering. In a general SBT film, the composition ratio among the respective elements, that is, strontium (Sr):bismuth (Bi):tantalum (Ta):oxygen (O), is 1:2:2:9, which is substantially equivalent to the stoichiometric composition ratio. However, in the ferroelectric film 23, the concentration of bismuth is high, so that the composition ratio of bismuth in the ferroelectric film 23 can be higher than that in the stoichiometric composition ratio. Specifically, the composition concentration ratio of the bismuth is preferably 1.1 through 3.5 times as high as that of the strontium. Thus, after the bismuth is diffused from the ferroelectric film 23 to the lower electrode 21 through annealing, the bismuth composition becomes substantially homogeneous in the ferroelectric film 23. Therefore, the composition shift is prevented, so that the ferroelectric film 23 can attain a sufficient ferroelectric characteristic. Also, without using a platinum film for preventing the composition shift of the ferroelectric film 23 as in the conventional technique, the metal film more easily dry etched than a platinum film can be used as the electrode, and therefore, the occurrence of a processing defect in the ferroelectric capacitive element can be prevented.

Alternatively, the ferroelectric film 23 may have, before the annealing, a structure in which first and second ferroelectric films are successively stacked in this order in the upward direction from the side of the lower electrode 21 with the concentration of the bismuth set to be higher in the first ferroelectric film than in the second ferroelectric film. Thus, after the bismuth is diffused from the first ferroelectric film to the lower electrode 21 through the annealing described below, the bismuth composition becomes substantially homogeneous in the whole of the first and second ferroelectric films. Therefore, the composition shift is prevented so that the ferroelectric film can attain a sufficient ferroelectric characteristic. Also, without using a platinum film for preventing the composition shift of the ferroelectric film 23 as in the conventional technique, the metal film more easily dry etched than a platinum film can be used as the electrode, and therefore, the occurrence of a processing defect of the ferroelectric capacitive element can be prevented.

Alternatively, the ferroelectric film 23 may have, before the annealing, a structure composed of a single layer. In this case, the ferroelectric film 23 is formed so that the concentration of the bismuth therein may have inclined gradient along the thickness direction of the ferroelectric film 23 so as to reduce from the side of the lower electrode 21 to the side of the upper electrode 24 described below. The ferroelectric film 23 having the inclined gradient in which the concentration of the bismuth is reduced from the side of the lower electrode 21 to the side of the upper electrode 24 can be formed by, for example, adjusting the amount of bismuth while allowing a gas including bismuth to continuously flow. Thus, the same effect as that described above can be attained, and in addition, since the inclined gradient of the concentration of the bismuth can be more finely caused, the bismuth composition in the ferroelectric film 23 can be more easily made homogenous. As a result, the ferroelectric film 23 can attain a more sufficient ferroelectric characteristic.

Alternatively, the ferroelectric film 23 may have, before the annealing, a multilayered structure in which each layer includes bismuth. In this case, the respective layers included in the ferroelectric film are formed so that the concentrations of the bismuth included therein are gradually reduced from the side of the lower electrode 21 to the side of the upper electrode 24 described below. In this manner, the same effect as that described above can be attained, and in addition, since the inclined gradient of the concentration of the bismuth can be more finely adjusted, the bismuth composition in the ferroelectric film can be more easily made substantially homogeneous. As a result, the ferroelectric film 23 can attain a more sufficient ferroelectric characteristic.

Also, without using a platinum film for preventing the composition shift of the ferroelectric film 23 as in the conventional technique, the metal film more easily dry etched than a platinum film can be used as the electrode, and therefore, the occurrence of a processing defect of the ferroelectric capacitive element can be prevented.

Figure 10B:
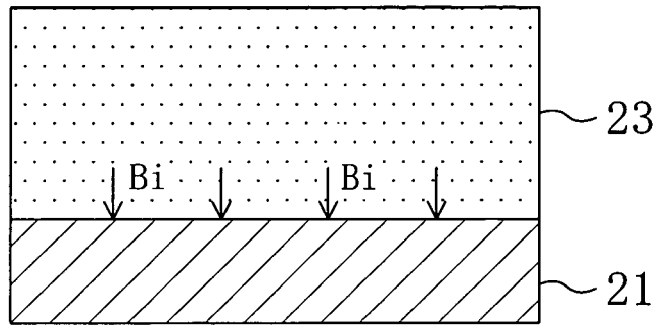
Figure 10C:
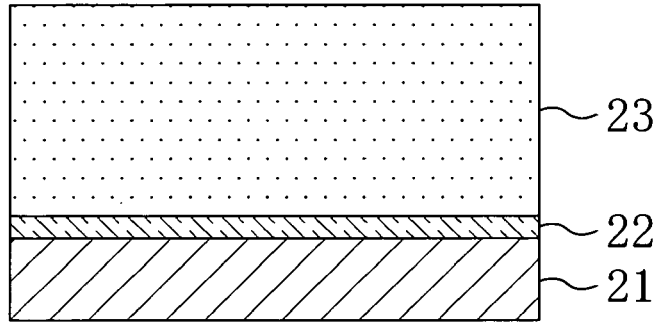
Figure 10D:
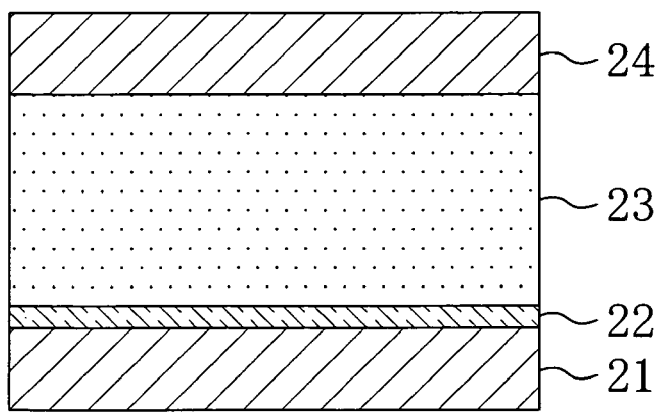

Next, as shown in FIG. 10B, the ferroelectric film 23 is subjected to the annealing. The annealing is performed in an $O_3$ atmosphere at a temperature of 800° C. for 1 through 30 minutes. Through this annealing, the bismuth included in the ferroelectric film 23 is diffused. Since the lower electrode 21 is made from the material including the group V element, the annealing accelerates the diffusion of the bismuth from the SBT film or the SBTN film used as the ferroelectric film 23. In addition, a chemical reaction is caused between the bismuth diffused from the ferroelectric film 23 and the group V element included in the lower electrode 21 during the annealing, so that the layer 22 including the group V element and the bismuth can be easily formed between the ferroelectric film 23 and the lower electrode 21 as shown in FIG. 10C. Since the layer 22 including the group V element and the bismuth is thus formed between the ferroelectric film 23 and the lower electrode 21, the bismuth diffused from the ferroelectric film 23 can be efficiently captured. Therefore, when the layer having captured the bismuth is analyzed, the amount of bismuth diffused from and going out of the ferroelectric film 23 can be previously grasped, and hence, the composition of the ferroelectric film 23 can be more effectively controlled. Specifically, the bismuth diffused from and going out of the ferroelectric film is not captured but reaches the side of the lower electrode in Embodiment 1 or 2, and therefore, it is not easy to predict the amount of bismuth diffused from and going out of the ferroelectric film. Accordingly, the control of the composition of the ferroelectric film is unavoidably unstable. In contrast, in this embodiment, the composition of the ferroelectric film 23 can be more accurately controlled. Therefore, the ferroelectric characteristic can be improved. Also, since the lower electrode 21 is made from the material including the group V element, the diffusion of the bismuth from the ferroelectric film 23 through the annealing can be accelerated. Therefore, the bismuth composition in the whole ferroelectric film 23 can be more easily made substantially homogeneous in a shorter period of time, and in addition, the composition of the ferroelectric film 23 can be accurately controlled. As a result, the ferroelectric film 23 can attain a more sufficient ferroelectric characteristic.

Then, as shown in FIG. 10C, the upper electrode 24 is formed on the ferroelectric film 23. The upper electrode 24 may be made of a generally used platinum film.

Now, the polarization characteristic of the ferroelectric capacitive element of this embodiment attained after the annealing will be described with reference to FIG. 11.

Figure 11:
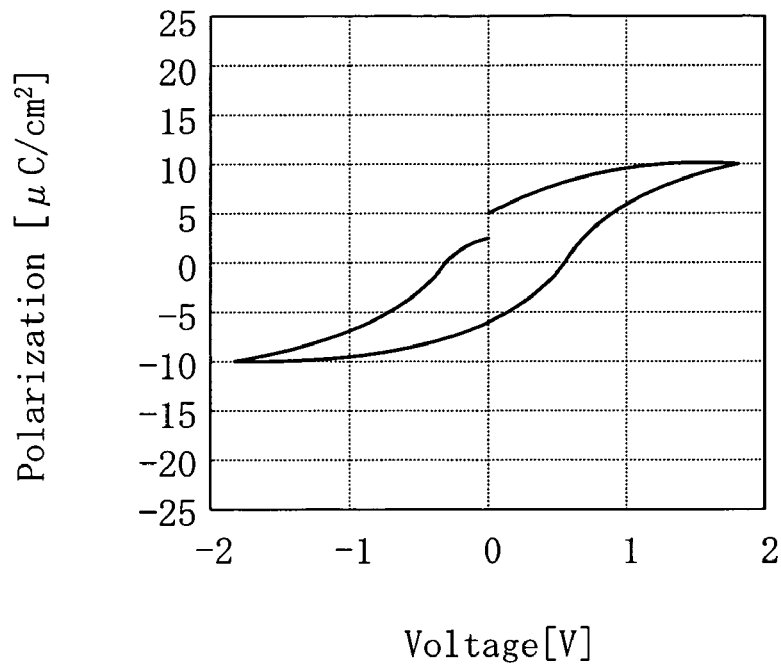
FIG. 11 is a graph for showing the polarization characteristic of the ferroelectric capacitive element obtained after annealing of Embodiment 3.

As is obvious from FIG. 11, the ferroelectric capacitive element of this embodiment attains the ferroelectric polarization characteristic of approximately 17 µC/cm². In this manner, the ferroelectric capacitive element of this embodiment has, after the annealing, a sufficient polarization characteristic to be used as a ferroelectric capacitive element of a semiconductor device.

Although the SBT film or the SBTN film is used as the ferroelectric film 23 in Embodiment 3, the same effect can be attained even when another Bi-based layered perovskite type ferroelectric film, such as a BLT film, is used. In this case, the lower electrode preferably includes a group IV element, and a layer including the group IV element and La is formed between the ferroelectric film and the lower electrode.

Embodiment 4

A semiconductor device including a ferroelectric capacitive element according to Embodiment 4 of the invention will now be described with reference to FIG. 12.

Figure 12:
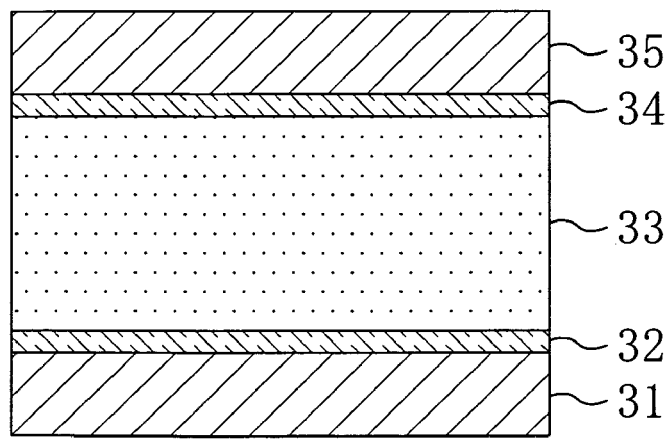
FIG. 12 is a cross-sectional view of a principal part of a ferroelectric capacitive element according to Embodiment 4 of the invention.

FIG. 12 is a cross-sectional view for showing the structure of a principal part of the ferroelectric capacitive element of Embodiment 4.

As shown in FIG. 12, a lower electrode 31 is formed on a substrate (not shown). A material used for forming the lower electrode 31 includes a group V element, and the lower electrode 31 is made from, for example, IrTa, IrPa, IrNb, $IrTaO_x$, $IrPaO_x$ or $IrNbO_x$. Also, the lower electrode 31 preferably has a thickness of 100 through 500 nm, and the material including the group V element may be used merely in an upper portion with a thickness of 50 through 100 nm of the lower electrode 31. It is noted that a MOS transistor for providing a function as a semiconductor memory device to the semiconductor device is formed on the substrate, and a semiconductor thin film such as a polysilicon film, an amorphous silicon film, a $SiO_2$ film or a silicon nitride film, an aluminum interconnect layer or a Cu interconnect layer may be formed on the substrate.

Furthermore, a layer 32 including the group V element and bismuth is formed on the lower electrode 31. The layer 32 including the group V element and bismuth is made from BiTa, BiPa, BiNb, $BiTaO_x$, $BiPaO_x$ or $BiNbO_x$.

Moreover, a ferroelectric film 33 of an SBT film or an SBTN film is formed on the layer 32 including the group V element and bismuth. Although not shown in the drawing, an upper electrode is formed on the ferroelectric film 33 and the upper electrode may be made of a generally used platinum film.

Also, a layer 34 including the group V element and bismuth is formed on the ferroelectric film. The layer 34 including the group V element and bismuth is made from BiTa, BiPa, BiNb, $BiTaO_x$, $BiPaO_x$ or $BiNbO_x$.

Furthermore, an upper electrode 35 is formed on the layer 34 including the group V element and bismuth. A material used for forming the upper electrode 35 includes a group V element, and the upper electrode 35 is made from, for example, IrTa, IrPa, IrNb, $IrTaO_x$, $IrPaO_x$ or $IrNbO_x$. Also, the upper electrode 35 preferably has a thickness of 100 through 500 nm, and the material including the group V element may be used merely in a lower portion with a thickness of 50 through 100 nm of the upper electrode 35.

Now, a method for fabricating the semiconductor device including the ferroelectric capacitive element of Embodiment 4 will be described with reference to FIGS. 13A through 13D.

FIGS. 13A through 13D are cross-sectional views for showing procedures in a method for fabricating the principal part of the ferroelectric capacitive element of Embodiment 4.

Figure 13A:
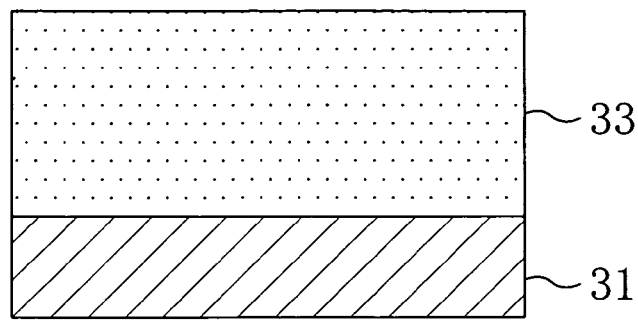
FIGS. 13A, 13B, 13C and 13D are cross-sectional views for showing procedures in a method for fabricating the principal part of the ferroelectric capacitive element of Embodiment 4.

First, as shown in FIG. 13A, the lower electrode 31 is formed on the substrate (not shown). A material used for forming the lower electrode 31 includes a group V element, and the lower electrode 31 is made from, for example, IrTa, IrPa, IrNb, $IrTaO_x$, $IrPaO_x$ or $IrNbO_x$. Also, the lower electrode 31 preferably has a thickness of 100 through 500 nm, and the material including the group V element may be used merely in an upper portion with a thickness of 50 through 100 nm of the lower electrode 31.

Next, the ferroelectric film 33 is formed on the lower electrode 31 by the MOCVD, the MOD or the sputtering. In a general SBT film, the composition ratio among the respective elements, that is, strontium (Sr):bismuth (Bi):tantalum (Ta):oxygen (O), is 1:2:2:9, which is substantially equivalent to the stoichiometric composition ratio. However, in the ferroelectric film 33, the concentration of bismuth is high, so that the composition ratio of the bismuth in the ferroelectric film 33 can be higher than that in the stoichiometric composition ratio. Specifically, the composition concentration ratio of the bismuth is preferably 1.1 through 3.5 times as high as the composition concentration of the strontium. Thus, after the bismuth is diffused from the ferroelectric film 33 to the lower electrode 31 and the upper electrode 35 through annealing, the bismuth composition becomes substantially homogeneous in the ferroelectric film 33. Therefore, the composition shift is prevented, so that the ferroelectric film 33 can attain a sufficient ferroelectric characteristic. Also, without using a platinum film for preventing the composition shift of the ferroelectric film 33 as in the conventional technique, the metal film more easily dry etched than a platinum film can be used as the electrode, and therefore, the occurrence of a processing defect in the ferroelectric capacitive element can be prevented.

Alternatively, the ferroelectric film 33 may have, before the annealing, a structure in which first, second and third ferroelectric films are successively stacked in this order in the upward direction from the side of the lower electrode 31 with the concentration of bismuth set to be higher in the first and third ferroelectric films than in the second ferroelectric film. In other words, the concentration of the bismuth in a film in contact with the lower electrode 31 or the upper electrode 35 described below is higher than that in a sandwiched film. Thus, after the bismuth is diffused from the first ferroelectric film to the lower electrode 31 or the upper electrode 35 through the annealing described below, the bismuth composition becomes substantially homogeneous in the whole of the first, second and third ferroelectric films. Therefore, the composition shift is prevented so that the ferroelectric film 33 can attain a sufficient ferroelectric characteristic. Also, without using a platinum film for preventing the composition shift of the ferroelectric film 33 as in the conventional technique, the metal film more easily dry etched than a platinum film can be used as the electrode, and therefore, the occurrence of a processing defect of the ferroelectric capacitive element can be prevented.

Alternatively, the ferroelectric film 33 may have, before the annealing, a structure composed of a single layer. In this case, the ferroelectric film 33 is formed so that the concentration of the bismuth therein may have inclined gradient along the thickness direction of the ferroelectric film 33 so as to reduce from the side of the lower electrode 31 to the side of the upper electrode 35 described below. The ferroelectric film 33 having the inclined gradient in which the concentration of the bismuth is reduced from the side of the lower electrode 31 to the side of the upper electrode 35 can be formed by, for example, adjusting the amount of bismuth while allowing a gas including bismuth to continuously flow. Thus, the same effect as that described above can be attained, and in addition, since the inclined gradient of the concentration of bismuth can be more finely caused, the bismuth composition in the ferroelectric film 33 can be more easily made homogenous. As a result, the ferroelectric film 33 can attain a more sufficient ferroelectric characteristic.

Alternatively, the ferroelectric film 33 may have, before the annealing, a multilayered structure including more layers, each including bismuth, than the aforementioned three-layered structure. In this case, the respective layers included in the ferroelectric film may be formed so that the concentrations of the bismuth included therein are gradually reduced from the side of the lower electrode 31 to the side of the upper electrode 35 described below. In this manner, the same effect as that described above can be attained, and in addition, since the inclined gradient of the concentration of bismuth can be more finely adjusted, the bismuth composition in the ferroelectric film 33 can be more easily made substantially homogeneous. As a result, the ferroelectric film 33 can attain a more sufficient ferroelectric characteristic. Also, without using a platinum film for preventing the composition shift of the ferroelectric film 33 as in the conventional technique, the metal film more easily dry etched than a platinum film can be used as the electrode, and therefore, the occurrence of a processing defect of the ferroelectric capacitive element can be prevented.

Figure 13B:
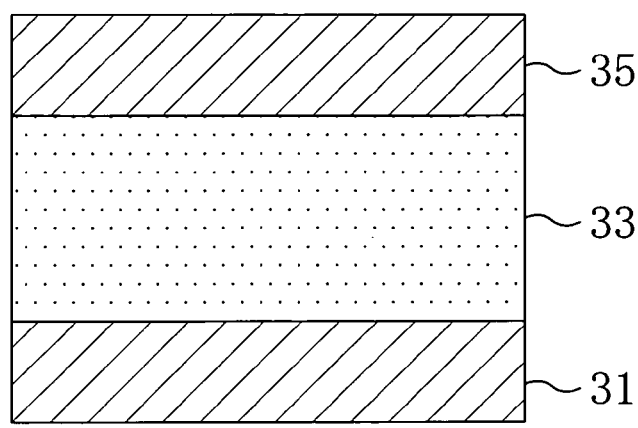

Next, as shown in FIG. 13B, the upper electrode 35 is formed on the ferroelectric film 33. In this case, the material used for forming the upper electrode 35 includes a group V element, and the upper electrode 35 is made from, for example, IrTa, IrPa, IrNb, $IrTaO_x$, $IrPaO_x$ or $IrNbO_x$. Also, the upper electrode 35 preferably has a thickness of 100 through 500 nm, and the material including the group V element may be used merely in a lower portion with a thickness of 50 through 100 nm of the upper electrode 35.

Figure 13C:
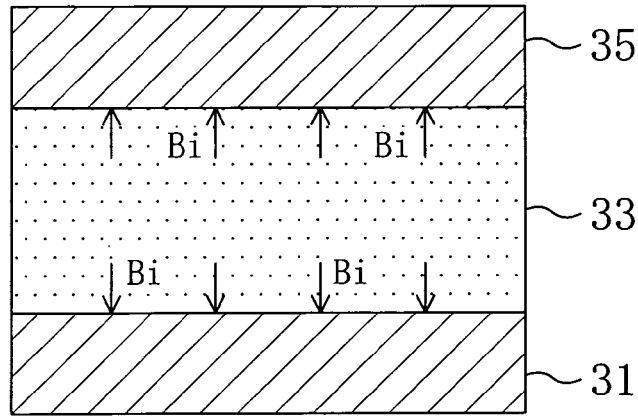
Figure 13D:
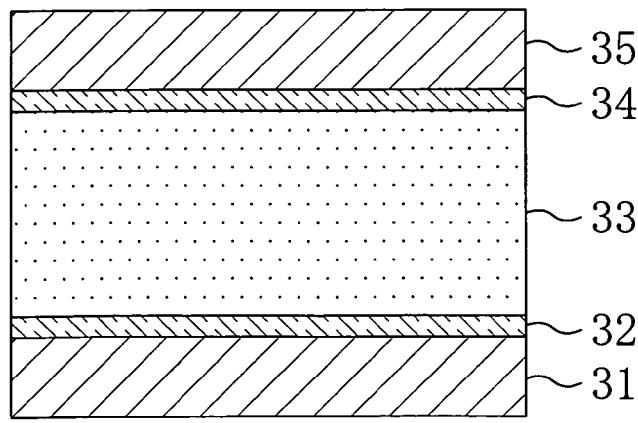
Figure 14:
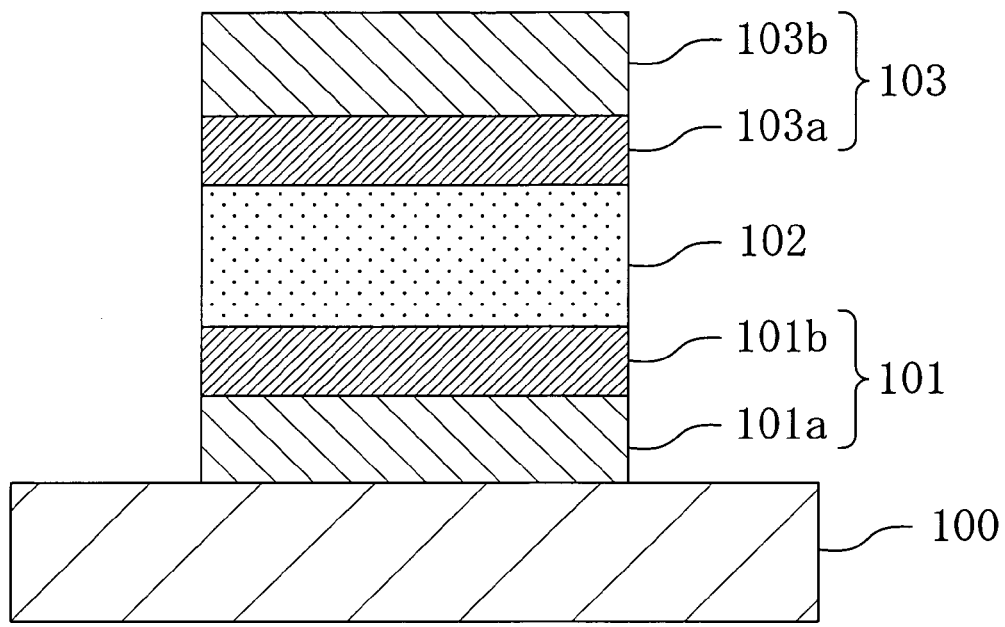
FIG. 14 is a cross-sectional view of a principal part of a semiconductor device including a conventional ferroelectric capacitive element.
Figure 15:
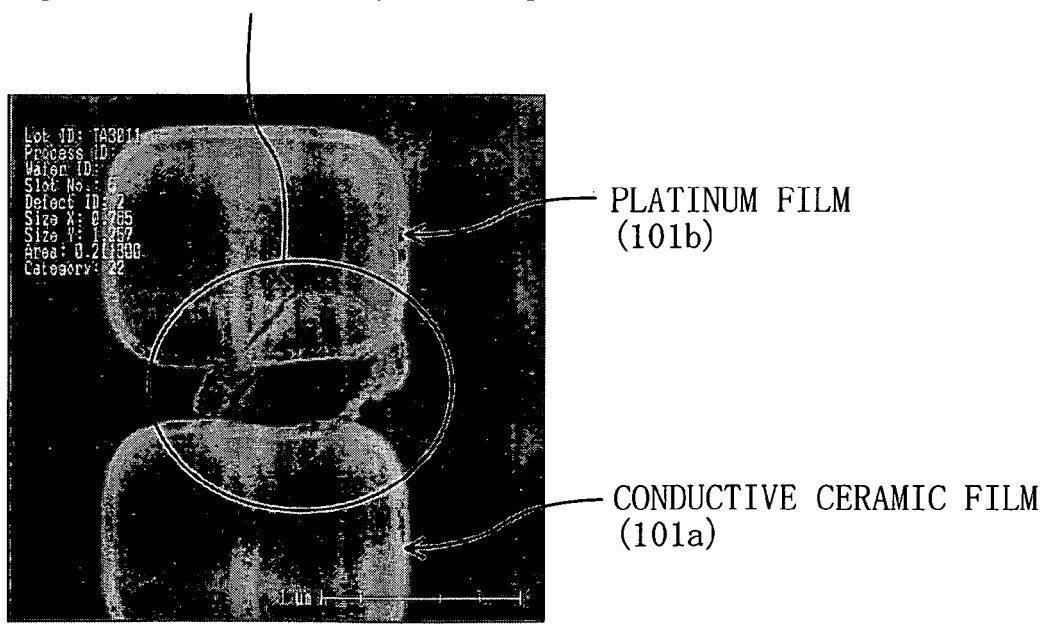
FIG. 15 is a diagram for showing an exemplified defect caused in refinement processing.

Then, as shown in FIG. 13C, the ferroelectric film 33 is subjected to the annealing. The annealing is performed in an $O_3$ atmosphere at a temperature of 800° C. for 1 through 30 minutes. Through this annealing, the bismuth included in the ferroelectric film 33 is diffused as shown in FIG. 13C. Since the lower electrode 31 and the upper electrode 35 are made from the material including the group V element, the annealing accelerates the diffusion of the bismuth from the SBT film or the SBTN film used as the ferroelectric film 33. In addition, a chemical reaction is caused between the bismuth diffused from the ferroelectric film 33 and the group V element included in the lower electrode 31 and the upper electrode 35 during the annealing, so that the layer 32 including the group V element and the bismuth can be easily formed between the ferroelectric film 33 and the lower electrode 31 and the layer 34 including the group V element and the bismuth can be easily formed between the ferroelectric film 33 and the upper electrode 35 as shown in FIG. 13D. Since the layers 32 and 34 including the group V element and the bismuth are thus formed, the bismuth diffused from the ferroelectric film 33 can be efficiently captured. Therefore, when the layers having captured the bismuth are analyzed, the amount of bismuth diffused from and going out of the ferroelectric film 33 can be previously predicted, and hence, the composition of the ferroelectric film 33 can be more effectively controlled. Specifically, the bismuth diffused from and going out of the ferroelectric film is not captured but reaches the side of the lower electrode or the upper electrode in Embodiment 1 or 2, and therefore, it is not easy to predict the amount of bismuth diffused from and going out of the ferroelectric film. Accordingly, the control of the composition of the ferroelectric film is unavoidably unstable. In contrast, in this embodiment, the composition of the ferroelectric film 33 can be more accurately controlled. Therefore, the ferroelectric characteristic can be improved. Also, since the lower electrode 31 and the upper electrode 35 are made from the material including the group V element, the diffusion of the bismuth from the ferroelectric film 33 through the annealing can be accelerated. Therefore, the bismuth composition in the whole ferroelectric film 33 can be more easily made substantially homogeneous in a shorter period of time, and in addition, the composition of the ferroelectric film 33 can be accurately controlled. As a result, the ferroelectric film 33 can attain a more sufficient ferroelectric characteristic.

Furthermore, as described above, Embodiment 4 is different from Embodiment 3 in performing the annealing after forming the upper electrode 35. Therefore, the semiconductor fabrication process cost can be reduced. This is for the following reason: In general, for planarization to eliminate a level difference between a memory (storage) part and a logic part of a semiconductor memory device, a method for performing planarization flow by annealing a BPSG film or a method for performing planarization CMP by annealing a BPSG film is employed. In such a fabrication method, when the ferroelectric film 33 is annealed after forming the upper electrode 35 as in this embodiment, the annealing of the ferroelectric film 33 and the annealing of the BPSG film can be simultaneously performed. As a result, the fabrication cost can be reduced.

Although the SBT film or the SBTN film is used as the ferroelectric film 33 in Embodiment 4, the same effect can be attained even when another Bi-based layered perovskite type ferroelectric film, such as a BLT film, is used. In this case, the lower electrode and the upper electrode preferably include a group IV element, and layers including the group IV element and La are formed respectively between the ferroelectric film and the lower electrode and between the ferroelectric film and the upper electrode.

As described so far, according to the present invention, the composition shift of a ferroelectric capacitor dielectric film can be prevented and the occurrence of defects can be prevented in refinement processing without using a platinum film. Accordingly, the present invention is useful for a ferroelectric capacitive element or the like using, as a capacitor dielectric film, a ferroelectric film, and more particularly, a film of a Bi-based layered perovskite type ferroelectric, that is, an insulating metal oxide.

What is claimed is:

1. A method for fabricating a ferroelectric capacitive element comprising the steps of:

forming a lower electrode on a substrate;

forming a ferroelectric film on said lower electrode;

forming a layer including a group V element and bismuth between said lower electrode and said ferroelectric film by performing annealing after forming said ferroelectric film; and forming an upper electrode on said ferroelectric film.

2. The method for fabricating a ferroelectric capacitive element of claim 1, wherein the step of performing annealing is conducted before the step of forming said upper electrode.

3. The method for fabricating a ferroelectric capacitive element of claim 2, wherein said ferroelectric film is made of an SBT film or an SBTN film.

4. The method for fabricating a ferroelectric capacitive element of claim 3, wherein said ferroelectric film before the annealing has a bismuth composition ratio higher than a bismuth composition ratio in stoichiometric composition.

5. The method for fabricating a ferroelectric capacitive element of claim 3, wherein said ferroelectric film before the annealing is formed such that a bismuth concentration on the side of said upper electrode is lower than a bismuth concentration on the side of said lower electrode.

6. The method for fabricating a ferroelectric capacitive element of claim 3, wherein said layer including a group V element and bismuth is made from BiTa, BiPa, BiNb, $BiTaO_x$, $BiPaO_x$ or $BiNbO_x$.

7. The method for fabricating a ferroelectric capacitive element of claim 3, wherein an upper portion of said lower electrode is made from a material including said group V element.

8. The method for fabricating a ferroelectric capacitive element of claim 7, wherein said material including said group V element is IrTa, IrPa, IrNb, $IrTaO_x$, $IrPaO_x$, or $IrNbO_x$.

* * * * *